United States Patent
Brown et al.

(10) Patent No.: US 12,100,575 B2
(45) Date of Patent: Sep. 24, 2024

(54) PLASMA PROCESSING DEVICES HAVING MULTI-PORT VALVE ASSEMBLIES

(71) Applicant: Lam Research Corporation, Fremont, CA (US)

(72) Inventors: Daniel A. Brown, Pleasanton, CA (US); Michael C. Kellogg, San Francisco, CA (US); Leonard J. Sharpless, Fremont, CA (US); Allan K. Ronne, Santa Clara, CA (US); James E. Tappan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 974 days.

(21) Appl. No.: 16/030,489

(22) Filed: Jul. 9, 2018

(65) Prior Publication Data

US 2018/0323041 A1    Nov. 8, 2018

Related U.S. Application Data

(63) Continuation of application No. 14/880,088, filed on Oct. 9, 2015, now Pat. No. 10,037,869, which is a
(Continued)

(51) Int. Cl.
*H01J 37/32*    (2006.01)

(52) U.S. Cl.
CPC .. *H01J 37/32449* (2013.01); *H01J 37/32513* (2013.01); *H01J 37/32816* (2013.01); *H01J 37/32834* (2013.01)

(58) Field of Classification Search
CPC ............ C23C 16/4409; C23C 16/4412; C23C 16/45557; C23C 16/45589; H01J 37/32431; H01J 37/32449; H01J 37/32513; H01J 37/32697; H01J 37/32816; H01J 37/32825; H01J 37/32834; G05D 27/02; G05D 7/0635; G05D 9/12
See application file for complete search history.

(56) References Cited

U.S. PATENT DOCUMENTS 5,415,728 A * 5/1995 Hasegawa ......... H01L 21/32137
438/710
5,997,589 A * 12/1999 Tien .................... C23C 16/4412
29/25.01
(Continued)

FOREIGN PATENT DOCUMENTS

JP           2001267293 A *   9/2001   ........ H01J 37/32834

*Primary Examiner* — Benjamin Kendall
(74) *Attorney, Agent, or Firm* — PENILLA IP, APC

(57) ABSTRACT

A plasma processing device may include a plasma processing chamber, a plasma electrode assembly, a wafer stage, a plasma producing gas inlet, a plurality of vacuum ports, at least one vacuum pump, and a multi-port valve assembly. The multi-port valve assembly may comprise a movable seal plate positioned in the plasma processing chamber. The movable seal plate may comprise a transverse port sealing surface that is shaped and sized to completely overlap the plurality of vacuum ports in a closed state, to partially overlap the plurality of vacuum ports in a partially open state, and to avoid substantial overlap of the plurality of vacuum ports in an open state. The multi-port valve assembly may comprise a transverse actuator coupled to the movable seal plate and a sealing actuator coupled to the movable seal plate.

30 Claims, 20 Drawing Sheets

Related U.S. Application Data continuation-in-part of application No. 13/965,796, filed on Aug. 13, 2013, now abandoned.

(56) References Cited

U.S. PATENT DOCUMENTS

| | | | | |
|---|---|---|---|---|
| 6,598,851 B2* | 7/2003 | Schiavone | F04B 39/08 | 251/129.11 |
| 6,634,845 B1* | 10/2003 | Komino | H01L 21/67745 | 414/217 |
| 8,257,497 B2* | 9/2012 | Sarigiannis | H01L 21/28562 | 118/715 |
| 8,267,636 B2* | 9/2012 | Hofmeister | H01L 21/67742 | 414/744.5 |
| 2013/0264194 A1* | 10/2013 | Xu | C23C 16/52 | 204/192.38 |

* cited by examiner

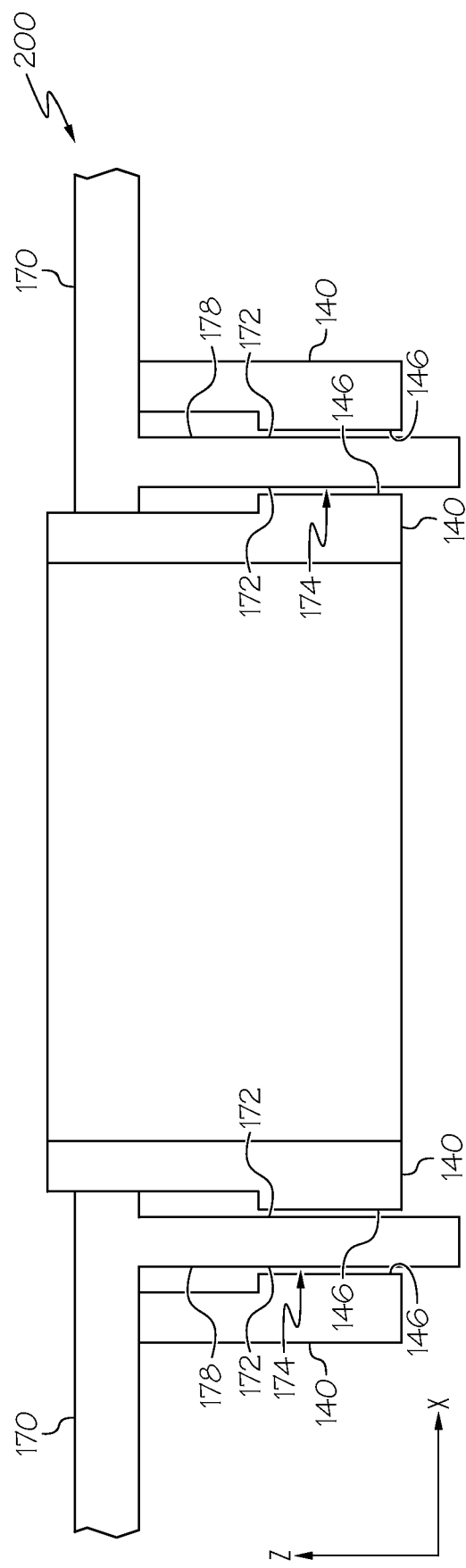
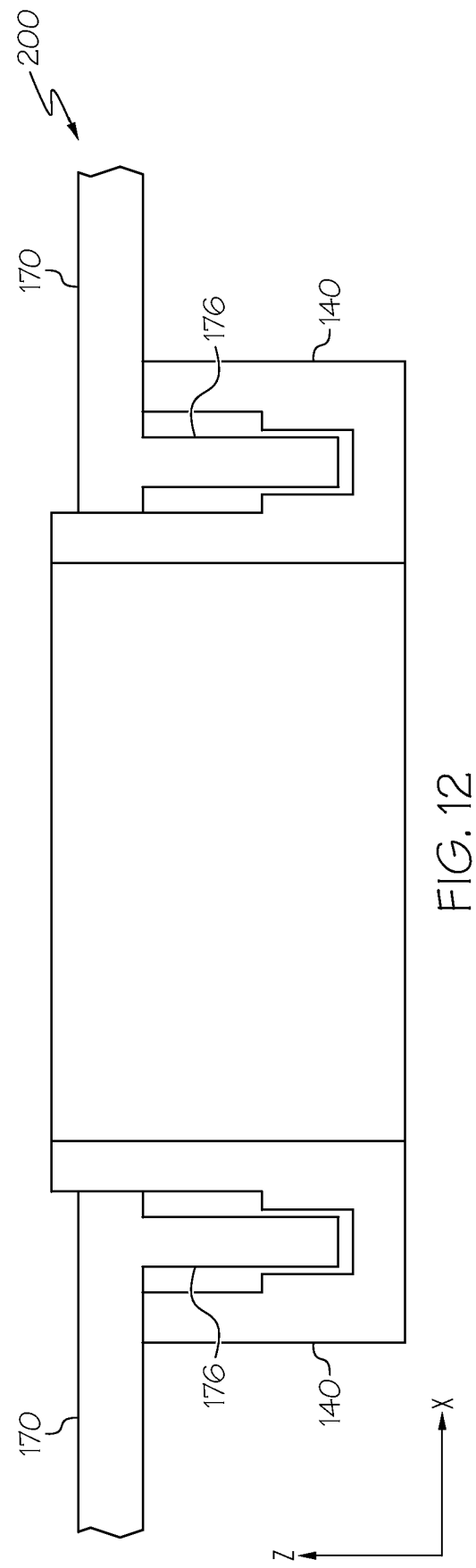

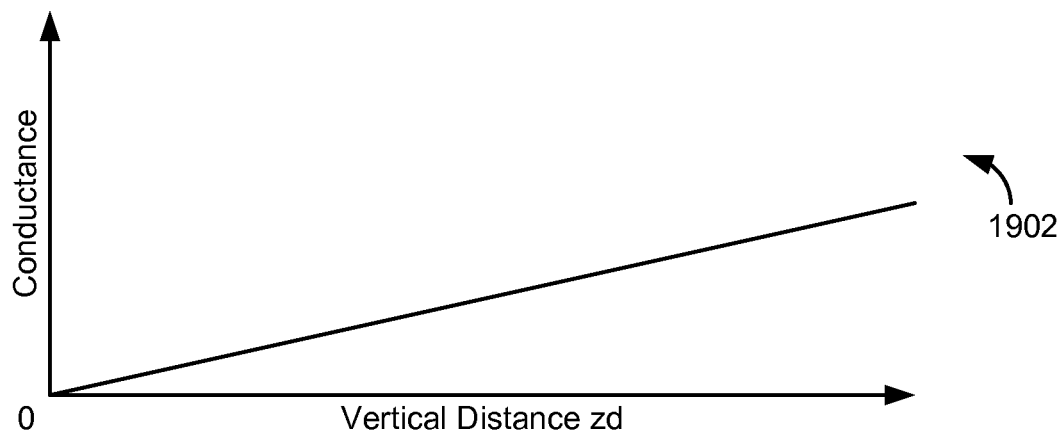
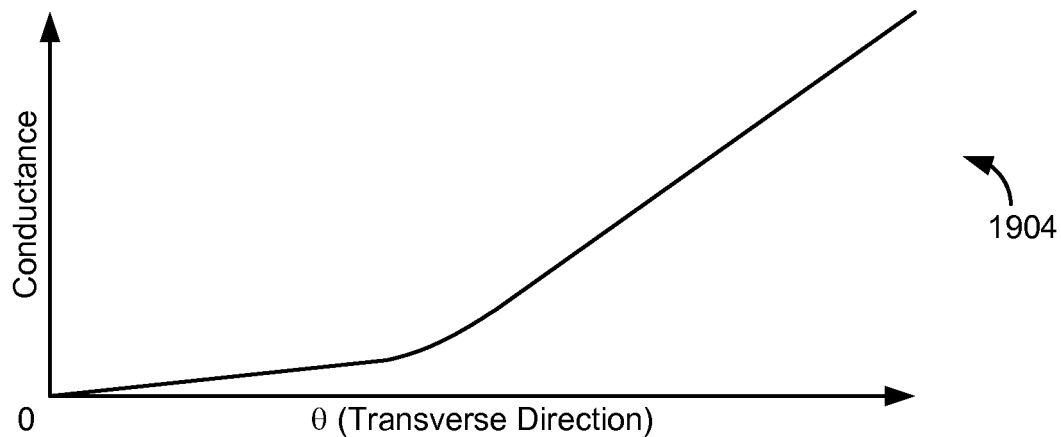
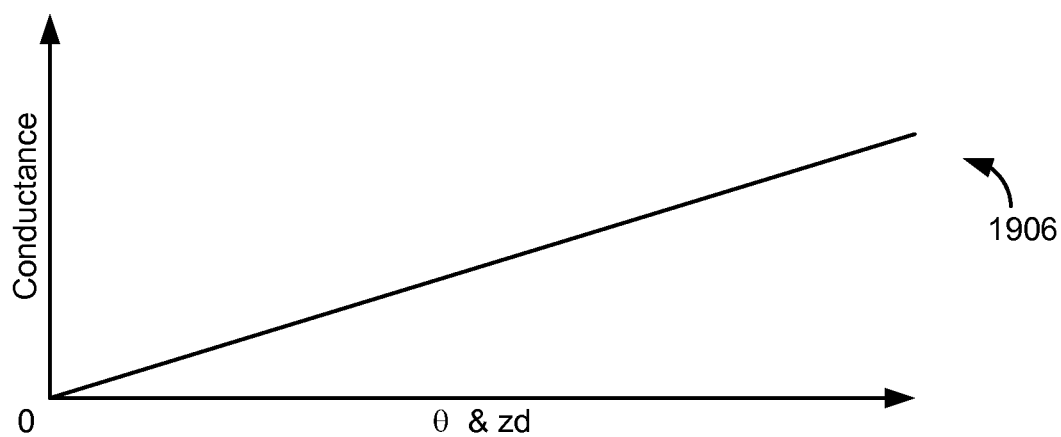
FIG. 19

PLASMA PROCESSING DEVICES HAVING MULTI-PORT VALVE ASSEMBLIES

CLAIM OF PRIORITY

This application is a continuation of and claims priority, under 35 U.S.C. § 120, to co-pending U.S. application Ser. No. 14/880,088, filed on Oct. 9, 2015, and titled "Plasma Processing Devices Having Multi-Port Valve Assemblies", which is a continuation-in-part of and claims priority, under 35 U.S.C. § 120, to U.S. application Ser. No. 13/965,796, filed on Aug. 13, 2013, and titled "Plasma Processing Devices Having Multi-Port Valve Assemblies", both of which are incorporated by reference herein in their entirety.

BACKGROUND

The present specification generally relates to plasma processing devices and, more specifically, to valves for plasma processing devices.

SUMMARY

Plasma processing devices typically comprise a plasma processing chamber that is connected to one or more vacuum pumps. The plasma processing device may comprise one or more valves that regulate the fluid communication between the chamber and the vacuum pumps. Embodiments described herein relate to plasma processing devices having multi-port valve assemblies. According to one embodiment, a plasma processing device may comprise a plasma processing chamber, a plasma electrode assembly, a wafer stage, a plasma producing gas inlet, a plurality of vacuum ports, at least one vacuum pump, and a multi-port valve assembly. The plasma electrode assembly and the wafer stage may be positioned in the plasma processing chamber and the plasma producing gas inlet may be in fluid communication with the plasma processing chamber. The vacuum pump may be in fluid communication with the plasma processing chamber via at least one of the vacuum ports. The multi-port valve assembly may comprise a movable seal plate positioned in the plasma processing chamber. The movable seal plate may comprise a transverse port sealing surface that is shaped and sized to completely overlap the plurality of vacuum ports in a closed state, to partially overlap the plurality of vacuum ports in a partially open state, and to avoid substantial overlap of the plurality of vacuum ports in an open state. The multi-port valve assembly may comprise a transverse actuator coupled to the movable seal plate, the transverse actuator defining a transverse range of actuation sufficient to transition the movable seal plate in a transverse direction between the closed state, the partially open state, and the open state, the transverse direction being oriented to be in predominant alignment with a sealing surface of the movable seal plate. The multi-port valve assembly may comprise a sealing actuator coupled to the movable seal plate, the sealing actuator defining a sealing range of actuation sufficient to transition the movable seal plate back and forth along a seal engaging and disengaging path between a sealed state and an un-sealed state, the seal engaging and disengaging path being oriented to be predominantly normal to the sealing surface of the movable seal plate.

In another embodiment, a plasma processing device may comprise a plasma processing chamber, a plasma electrode assembly, a wafer stage, a plasma producing gas inlet, a plurality of vacuum ports, at least one vacuum pump, and a multi-port valve assembly. The plasma electrode assembly and the wafer stage may be positioned in the plasma processing chamber. The plasma producing gas inlet may be in fluid communication with the plasma processing chamber. The vacuum pump may be in fluid communication with the plasma processing chamber via at least one of the vacuum ports. The multi-port valve assembly may comprise a movable seal plate positioned in the plasma processing chamber. The movable seal plate may comprise a transverse port sealing surface that is shaped and sized to completely overlap the plurality of vacuum ports in a closed state, to partially overlap the plurality of vacuum ports in a partially open state, and to avoid substantial overlap of the plurality of vacuum ports in an open state. The multi-port valve assembly may comprise a transverse actuator coupled to the movable seal plate, the transverse actuator defining a transverse range of actuation sufficient to transition the movable seal plate in a transverse direction between the closed state, the partially open state, and the open state, the transverse direction being oriented to be in predominant alignment with a sealing surface of the movable seal plate. The transverse actuator may comprise a rotary motion actuator and the movable seal plate comprises a rotary movable seal plate comprising a central axis. The multi-port valve assembly may comprise a sealing actuator coupled to the movable seal plate, the sealing actuator defining a sealing range of actuation sufficient to transition the movable seal plate back and forth along a seal engaging and disengaging path between a sealed state and an un-sealed state, the seal engaging and disengaging path being oriented to be predominantly normal to the sealing surface of the movable seal plate.

In one embodiment, instead of multiple controllers, e.g., a master controller and a slave controller, etc., and multiple actuators to control multiple valves for multiple openings between a plasma processing chamber and multiple vacuum pumps, a single controller and a single actuator controls a single valve to open, close, seal, or unseal the openings simultaneously. The use of the single controller and single actuator saves time and costs associated with using the multiple controllers and actuators. Also, the use of the single actuator saves space occupied within a plasma processing chamber compared to the use of multiple actuators. Moreover, use of the single controller reduces chances of loss of communication between the master controller and slave controller while changing positions of the multiple valves.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 11 schematically depicts a cross-sectional view of a bearing assembly of a multi-port valve assembly, according to one or more embodiments of present disclosure; and FIG. 12 schematically depicts a cross-sectional view of a bearing assembly of a multi-port valve assembly, according to one or more embodiments of present disclosure.

FIG. 19 shows graphs to illustrate a change in flow conductance from an interior region to vacuum pumps of the plasma processing device of FIG. 1 with movement of the moveable seal plate or the top plate, according to one or more embodiments of present disclosure.

DETAILED DESCRIPTION

Figure 1:
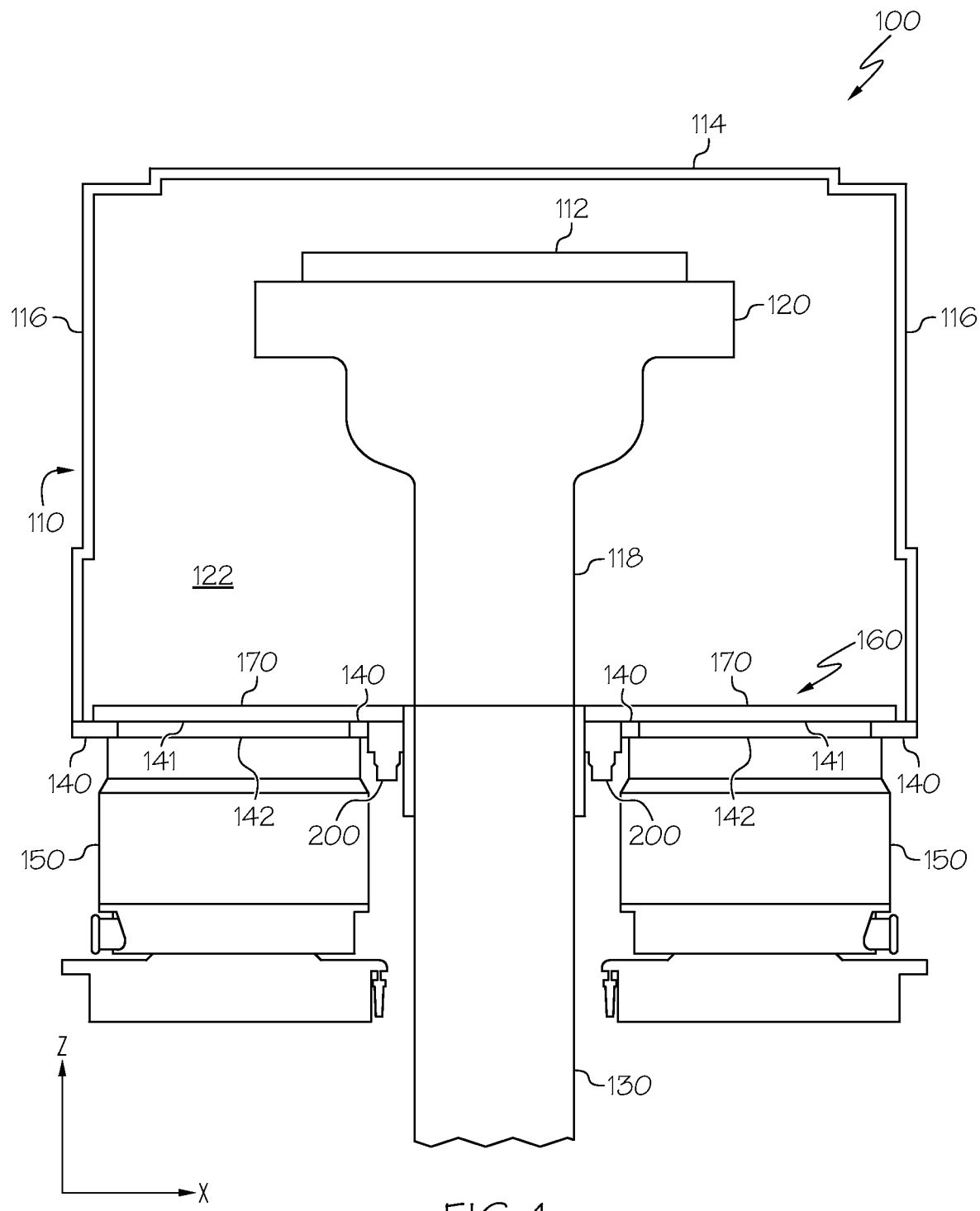
FIG. 1 schematically depicts a cut-away front view of a plasma processing device comprising a multi-port valve assembly, according to one or more embodiments of present disclosure.

Reference will now be made in detail to various embodiments of plasma processing apparatuses, examples of which are illustrated in the accompanying drawings. Whenever possible, the same reference numerals will be used throughout the drawings to refer to the same or like parts. In one embodiment, the plasma processing device may comprise a multi-port valve assembly that may regulate fluid communication between a plasma processing chamber of the plasma processing device and vacuum pumps attached thereto. The multi-port valve assembly may comprise a movable seal plate which may be operable to seal multiple vacuum ports while in a closed position and allow for fluid communication in an open or partially open state. The seal plate may be moved between the closed and open positions with one or more actuators moving a single seal plate. As such, each vacuum port may not require its own valve assembly with separate actuator and seal plate. Additionally, the multi-port valve assemblies described herein may not require grease, which may contaminate the substrate within the plasma processing chamber or the vacuum pumps. Furthermore, the multi-port valve assemblies described herein may be contained within the plasma processing chamber, allowing for reduced size of the plasma processing device.

Referring to FIG. 1, a plasma processing device 100 is depicted. Generally, a plasma processing device 100 may be utilized to etch material away from a substrate 112 formed from, for example, a semiconductor, such as silicon, or glass. For example, the substrate 112 may be a silicon wafer, for example a 300 mm wafer, a 450 mm wafer, or any other sized wafer. In one embodiment, a plasma processing device 100 may comprise at least a plasma processing chamber 110, a plasma electrode assembly 118, a wafer stage 120, a plasma producing gas inlet 130, at least one vacuum pump 150, a plurality of vacuum ports 142, and a multi-port valve assembly 160. Examples of the wafer stage 120 include a chuck, which includes an electrode and may include other components, e.g., a facility plate, a heater, etc. The plasma processing chamber 110 may comprise walls, such as a top wall 114, side walls 116, and a vacuum connection wall 140, which is a bottom wall of the plasma processing chamber 110. A plurality of vacuum ports 142 may be disposed through vacuum connection wall 140. While the vacuum connection wall 140 is depicted on the bottom of the plasma processing chamber 110 in FIG. 1, this position is only illustrative, and the vacuum connection wall 140 may be any wall of the plasma processing chamber 110. Each of the at least one vacuum pumps 150 may be in fluid communication with the plasma processing chamber 110 via at least one of the vacuum ports 142. In one embodiment, each vacuum pump 150 is in fluid communication with the plasma processing chamber 110 via a separate vacuum port 142. For example there may be three vacuum ports 142 disposed in the vacuum connection wall 140 that each are connected to separate vacuum pumps 150, respectively.

The plasma processing chamber 110 comprises an interior region 122 within which at least the plasma electrode assembly 118 and the wafer stage 120 may be positioned. The plasma processing chamber 110 may be operable to maintain a low pressure within its interior 122, such as while the multi-port valve assembly 160 is in a closed state following operation of the vacuum pumps 150. The plasma producing gas inlet 130 may be in fluid communication with the plasma processing chamber 110 and may deliver plasma producing gas into the interior region 122 of the plasma processing chamber 110. The plasma producing gas may be ionized and transformed into a plasma state gas which may be utilized for etching the substrate 112. For example an energized source (radio frequency (RF), microwave or other source) can apply energy to the process gas to generate the plasma gas. The plasma may etch the substrate 112, such as the wafer contained in the interior region 122 of the plasma processing chamber 110. The plasma electrode assembly 118 may comprise a showerhead electrode, and may be operative to specify a pattern of etching on the substrate. For example, U.S. Pub. No. 2011/0108524 discloses one embodiment of such a plasma processing device.

The multi-port valve assembly 160 may comprise a movable seal plate 170. The movable seal plate 170 may comprise a transverse port sealing surface 141. In some embodiments, the movable seal plate 170 may be positioned in the interior region 122 of the plasma processing chamber 110. The multi-port valve assembly 160 may further comprise a bearing assembly 200. The bearing assembly 200 may be operable to constrain the movement of the movable seal plate 170. Vacuum pumps 150 are depicted that may each be in fluid communication with the plasma processing device 100 via vacuum ports 142 while the movable seal plate 170 of the multi-port valve assembly 160 is in an open or partially open state. As used herein, an "open state" refers to the state of the multi-port valve assembly 160 where there is fluid communication between the interior region 122 of the plasma processing chamber 110 and the vacuum pumps 150. As used herein, a "closed state" or "sealed state" refers to the state of the multi-port valve assembly 160 where there is not fluid communication between the interior region 122 of the plasma processing chamber 110 and the vacuum pumps 150. There is a higher amount of fluid communication from the interior region 122 to the vacuum pumps 150 when the lobes 144 are in an unsealed state compared to when the lobes 144 are in the sealed state. As used herein, the open state (sometimes referred to as "fully open state"), partially open state, and closed state can refer to either the position of the movable seal plate 170 or the position of the multi-port valve assembly 160, and the reference to either the movable seal plate 170 or the multi-port valve assembly 160 as being in a particular state may be used interchangeably. The state of fluid communication (fully open, partially open, or closed) between the vacuum pumps 150 and the interior region 122 of the plasma processing chamber 110 are determined by the position of the movable seal plate 170.

In one embodiment, the multi-port valve assembly 160 is a part of the plasma processing chamber 110.

Referring now to FIGS. 1-4, the multi-port valve assembly 160 is depicted as coupled to the vacuum connection wall 140. The movable seal plate 170 may comprise a transverse port sealing surface 141 (underside of the movable seal plate 170). In one embodiment, the transverse port sealing surface 141 is substantially flat. The transverse port sealing surface 141 may be shaped and sized to completely overlap the plurality of vacuum ports 142 in a closed state (shown in FIG. 2), to partially overlap the plurality of vacuum ports 142 in a partially open state (shown in FIG. 4), and to avoid substantial overlap of the plurality of vacuum ports 142 in an open state (shown in FIG. 3). For example, an angle $\theta 1$ is formed between a transverse axis that passes through a center C1 of an opening O1 of the valve port 142 and an axis A1 that passes through a center of mass of the multi-port valve assembly 160. The axis A1 bisects a first one of the lobes 144 of the moveable seal plate 170. Moreover, an angle $\theta 2$ is formed between a transverse axis that passes through a center C2 of an opening O2 of the valve port 142 and an axis A2 that passes through the center of mass of the multi-port valve assembly 160. The axis A2 bisects a second one of the lobes 144 of the moveable seal plate 170. Also, an angle $\theta 3$ is formed between a transverse axis that passes through a center C3 of an opening O3 of the valve port 142 and an axis A3 that passes through the center of mass of the multi-port valve assembly 160. The axis A3 bisects a third one of the lobes 144 of the moveable seal plate 170.

In one embodiment, the angles $\theta 1$, $\theta 2$, and $\theta 3$ are controlled by a valve controller, which is further described below so that the three lobes 140 are in the partially open, closed, or open positions with respect to the openings of the valve ports 142.

In an embodiment, the angles $\theta 1$, $\theta 2$, and $\theta 3$ are controlled by the valve controller such that at all times, the angles $\theta 1$, $\theta 2$, and $\theta 3$ are equal. When the angles $\theta 1$, $\theta 2$, and $\theta 3$ are equal, a flow conductance of materials via the opening O1 is the same as a flow conductance of materials via the opening O2 and a flow conductance of materials via the opening O3.

Figure 2:
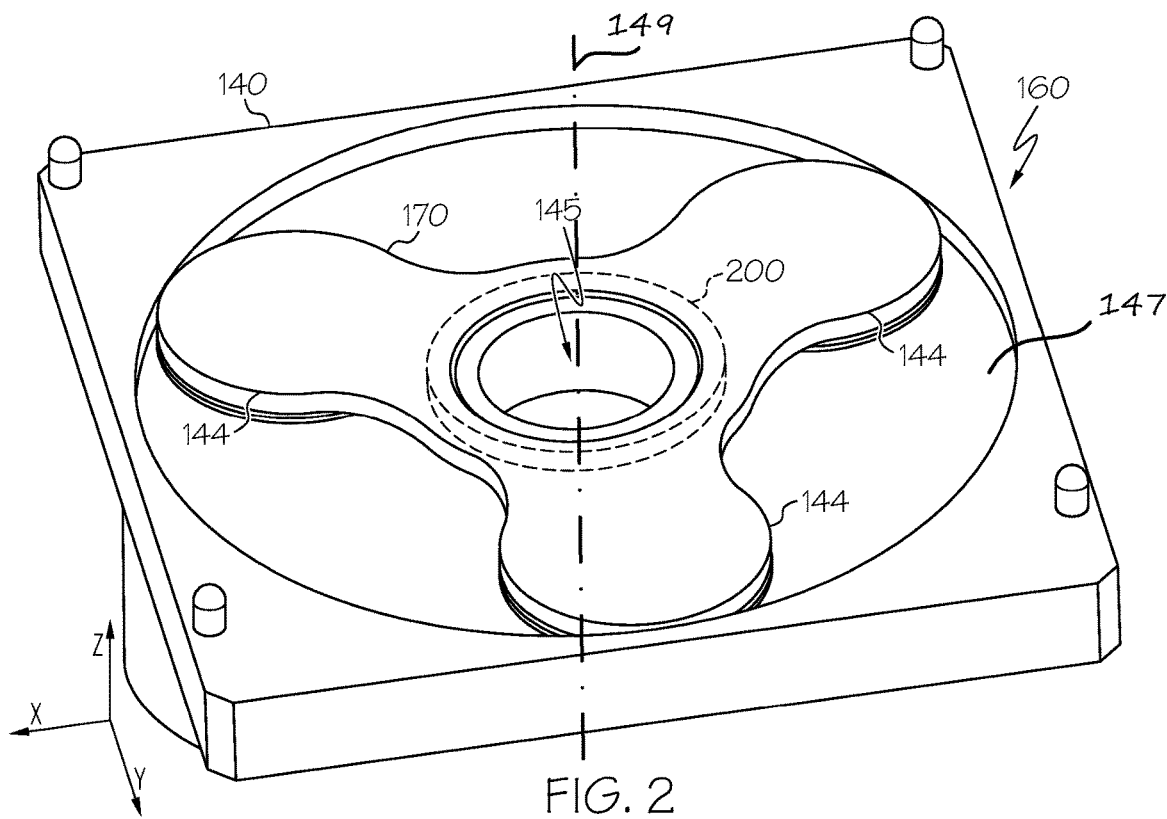
FIG. 2 schematically depicts a multi-port valve assembly in a closed state, according to one or more embodiments of present disclosure.
Figure 3:
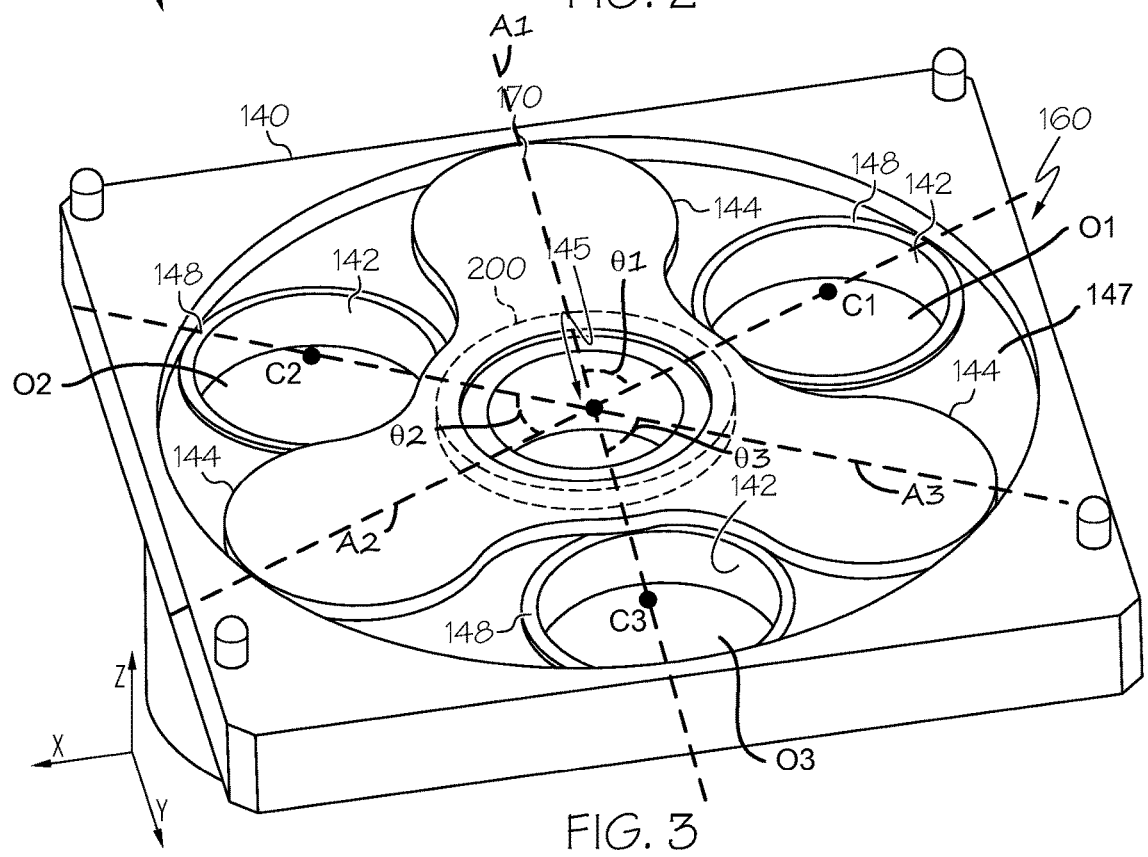
FIG. 3 schematically depicts a multi-port valve assembly in an open state, according to one or more embodiments of present disclosure.
Figure 4:
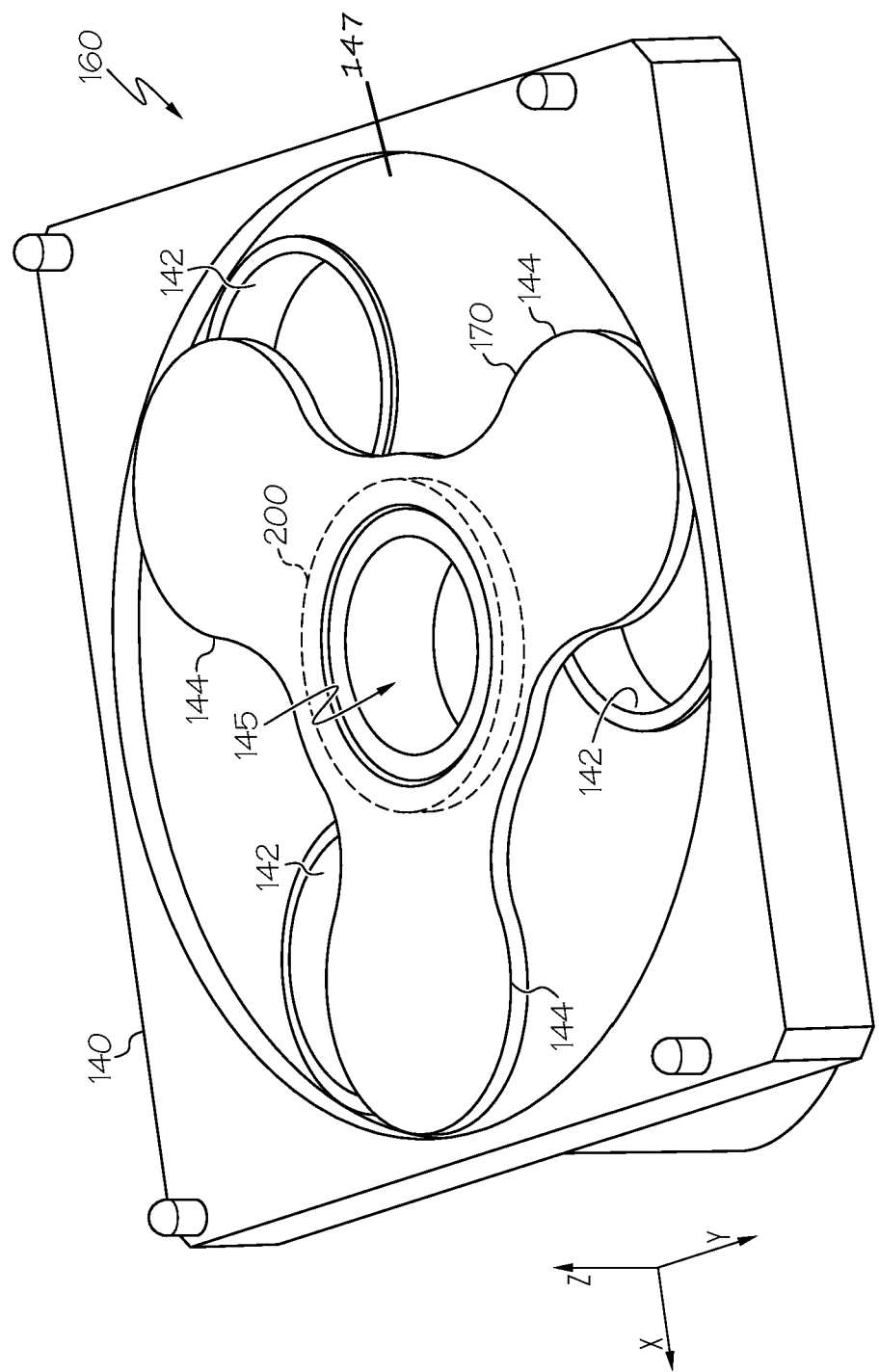
FIG. 4 schematically depicts a multi-port valve assembly in a partially open state, according to one or more embodiments of present disclosure.
Figure 10:
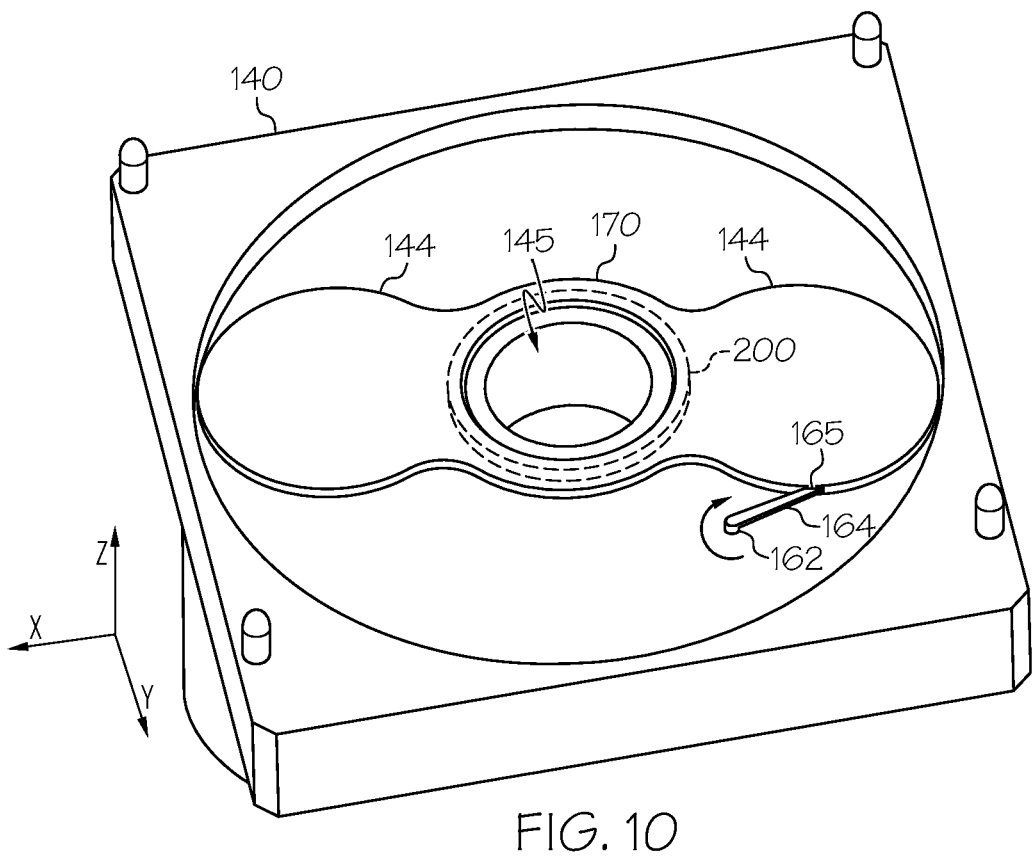
FIG. 10 schematically depicts a multi-port valve assembly, according to one or more embodiments of present disclosure.

The movable seal plate 170 may comprise a unitary structure and may comprise at least two sealing lobes 144. Each sealing lobe 144 may overlap a vacuum port 142 while the movable seal plate 170 is in the closed state. The sealing lobes 144 may be sized and positioned relative to each other to overlap corresponding individual vacuum ports 142. The sealing lobes 144 are positioned on top of a bottom plate 147 of the multi-port valve assembly 160. While FIGS. 2-4 depicts a vacuum connection wall 140 comprising three vacuum ports 142 with a seal plate comprising three corresponding sealing lobes 144, the vacuum connection wall 140 may comprise any number of vacuum ports 142 with a corresponding number of sealing lobes 144. For example, FIG. 10 schematically depicts a vacuum connection wall 140 comprising two vacuum ports 142 with a movable seal plate 170 comprising two corresponding sealing lobes 144. The multi-port valve assembly 160 may comprise a bearing assembly 200. The bearing assembly 200 may be disposed under the movable seal plate 170 and may be disposed above the vacuum connection wall 140, such as between the movable seal plate 170 and the vacuum connection wall 140.

The multi-port valve assembly 160 may comprise a feed through port 145. The feed through port 145 may surround at least a portion of the plasma electrode assembly 118 when configured onto the plasma processing device 100, and may allow the multi-port valve assembly 160 to fit around the plasma processing device 100 to inhibit fluid flow between the inner portion of the plasma processing chamber 110 and the surrounding environment. In one embodiment, the feed through port 145 may be substantially circularly shaped, such as to fit around a cylinder shaped section of a plasma electrode assembly 118. However, the feed through port 145 may have any shape such as to allow for free movement of the movable seal plate 170. The movable seal plate 170 may be disposed around the feed through port 145, and may completely surround the feed through port 145 in at least two dimensions.

FIG. 2 shows a multi-port valve assembly 160 in the closed state where the movable seal plate 170 is positioned such that the transverse port sealing surface 141 completely overlaps the plurality of vacuum ports 142. The multi-port valve assembly 160 may restrict fluid communication while in the closed state and form a hermetic seal. FIG. 3 shows a multi-port valve assembly 160 in the open state where the movable seal plate 170 is positioned to avoid substantial overlap with the plurality of vacuum ports 142. The multi-port valve assembly 160 does not substantially restrict fluid communication while in the open state. FIG. 4 shows a multi-port valve assembly 160 in the partially open state where the movable seal plate 170 is positioned to partially overlap the plurality of vacuum ports 142. The multi-port valve assembly 160 partially restricts fluid communication while in the partially open state. The partially open state may be utilized to throttle the vacuum pumps 150.

As shown in FIGS. 2-4, the movable seal plate 170 may be capable of moving in the transverse direction. As used herein, the "transverse" refers to a direction being oriented to be in predominant alignment with a sealing surface of the movable seal plate 170. For example, in FIGS. 2-4, the "transverse" direction lies substantially in the plane of the x-axis and y-axis. For example the seal plate 170 may move in a rotational or rotary path, referred to herein as a rotary seal plate. In some embodiments, the movable seal plate 170 may be a rotary movable seal plate. A rotary movable seal plate 170 may be capable of rotating around a central axis. Such a rotary movable seal plate 170 is depicted in the embodiments of FIGS. 2-4.

In some embodiments, the multi-port valve assembly 160 may comprise a transverse actuator. The transverse actuator may be coupled to the movable seal plate 170 and may define a transverse range of actuation. The transverse range of actuation may be sufficient to transition the movable seal plate 170 in a transverse direction between the closed state, the partially open state, and the open state. The transverse actuator may be any mechanical component capable of transitioning the movable seal plate 170 in a transverse direction, such as between the open and closed states. In one embodiment, the transverse actuator may be coupled by direct mechanical contact with the movable seal plate 170. In another embodiment, the transverse actuator may be coupled through non-contacting means, such as by magnetism. In one embodiment, the transverse actuator comprises a rotary motion actuator which can cause the movable seal plate 170 to rotate around a central axis, e.g., a vertical axis 149, of the bottom plate 147. The vertical axis 149 passes through a center of mass of the bottom plate 147.

The movable seal plate 170 may be capable of moving in a seal engaging/disengaging path. As used herein, the "engaging path" or "disengaging path" refers to the path being oriented to be predominantly normal to the sealing surface of the movable seal plate 170. For example, in FIGS. 2-4, the engaging path direction is substantially that of the z-axis. The movable seal plate 170 may be operable to move at least about 2 mm, 4 mm, 6 mm, 8 mm 10 mm, 12 mm, 20 mm, 50 mm, or more in the direction of the seal engaging/disengaging path. In one embodiment, the seal plate is operable to move between about 10 mm and about 15 mm in the direction of the seal engaging/disengaging path.

In some embodiments, the multi-port valve assembly 160 may comprise a sealing actuator. The sealing actuator may be coupled to the movable seal plate 170 and may define a sealing range of actuation. The sealing range of actuation may be sufficient to transition the movable seal plate 170 back and forth along the seal engaging and disengaging path between a sealed state and an un-sealed state. In one embodiment, the sealing actuator may be coupled by direct mechanical contact with the movable seal plate 170. In another embodiment, the sealing actuator may be coupled through non-contacting means, such as by magnetism.

In one embodiment, the movable seal plate 170 may be capable of moving in both the transverse direction and seal engaging/disengaging path direction.

Referring now to FIG. 3, in one embodiment, the multi-port valve assembly 160 may comprise at least one o-ring 148. The o-ring 148 may be positioned around one or more of the vacuum ports 142. The movable seal plate 170 may be in direct contact with each o-ring 148 while the movable seal plate 170 is in the closed state. The o-rings 148 may help to form a hermetic seal while the movable seal plate 170 is closed.

In one embodiment, the movable seal plate 170 transitions between the closed, partially open, and open states by movement of the seal plate 170 in both the transverse and sealing directions. In some embodiments, the movement of the seal plate 170 in the transverse and sealing directions may actuated by the transverse actuator and the sealing actuator, respectively. In other embodiments, the transverse actuator and the sealing actuator may comprise a single actuator that may actuate motion of the seal plate 170 in both the transverse and sealing directions.

In one embodiment, the closed state depicted in FIG. 2 may comprise the movable seal plate 170 in contact with the vacuum connection wall 140 and overlapping the vacuum ports 142. A hermetic seal may be formed. The movable seal plate 170 may be held towards the vacuum connection wall 140 in the z-axis direction by the sealing actuator.

To move to the partially open state, the sealing actuator may cause movement of the movable seal plate 170 in the z-axis direction away from the vacuum connection wall 140. Following movement by the movable seal plate 170 away from the vacuum connection wall 140, the transverse actuator may cause movement of the movable seal plate 170 in the transverse direction, such as rotation of the movable seal plate 170 to the partially open state depicted in FIG. 4. The movable seal plate 170 may be further rotated to achieve the open state depicted in FIG. 3. For example, the seal plate 170 may only need to rotate about 60° between the open and closed states in the embodiment of FIG. 2.

To move the movable seal plate 170 from the open state to the closed state, the transverse actuator may cause movement of the movable seal plate 170 in the transverse direction, such as rotation of the movable seal plate 170 to the partially open state depicted in FIG. 4. The movable seal plate 170 may be further rotated by the transverse actuator until it is completely overlapping the vacuum ports 142. Once the movable seal plate 170 is overlapping the vacuum ports 142, the sealing actuator may move the movable seal plate 170 towards the vacuum connection wall 140 until a hermetic seal is created which does not permit fluid communication between the plasma processing chamber 110 and the vacuum pumps 150.

In other embodiments, the movable seal plate 170 may move between open and closed states without utilizing movement in the z-axis direction. For example, the movable seal plate 170 may slide across the vacuum connection wall 140, staying always in contact with the vacuum connection wall 140. In another embodiment, the movable seal plate 170 may move between open and closed states without utilizing movement in transverse direction. For example, the movable seal plate 170 may move only in the z-axis direction to allow for fluid communication and disallow fluid communication.

Referring to FIGS. 1 and 5-7, the multi-port valve assembly 160 may further comprise a bearing assembly 200. The bearing assembly 200 may be operable to constrain the movement of the movable seal plate 170 in the transverse direction, a direction of the seal engaging and disengaging path, or both. While several embodiments of bearing assemblies 200 are disclosed herein, it should be understood that the bearing assembly 200 may be any mechanical or other device or system capable restricting the movement of the movable seal plate 170. For example, in one embodiment, the bearing assembly 200 may define a range of motion constrained by a guiding means such as a track 186.

Figure 5:
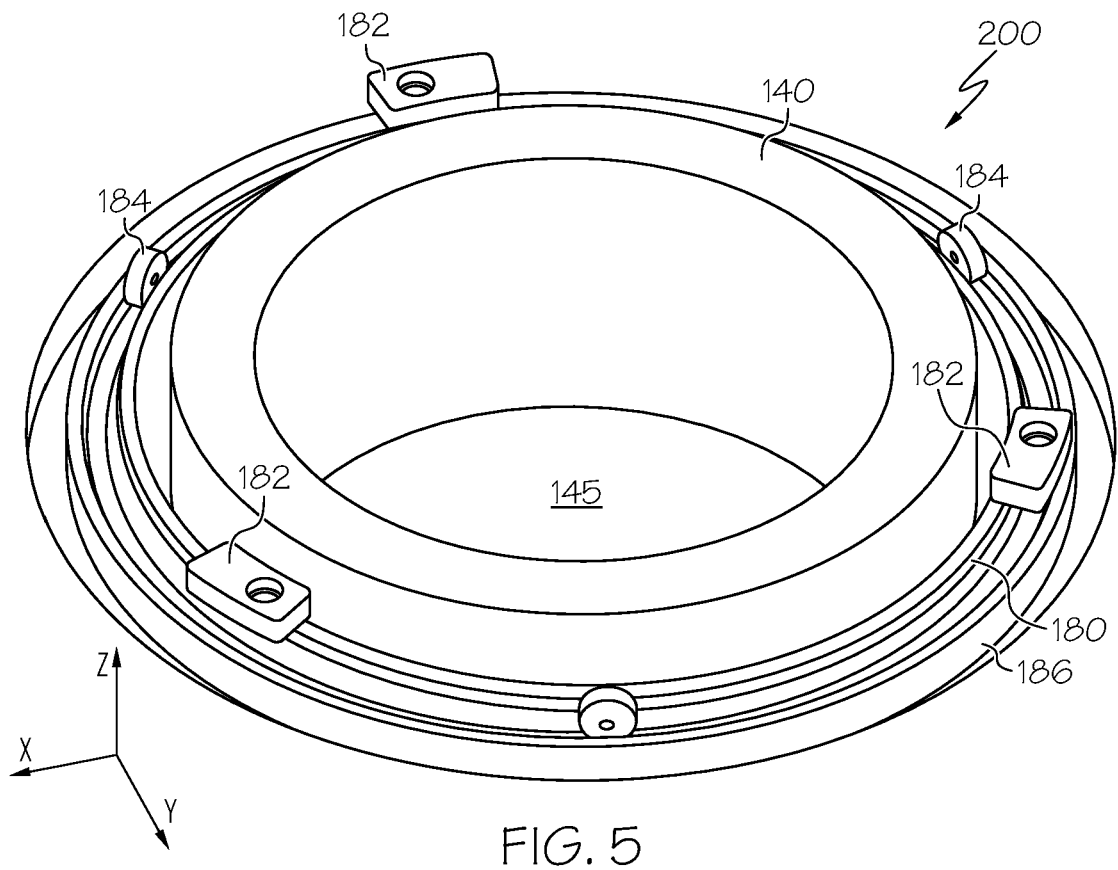
FIG. 5 schematically depicts a of a bearing assembly of a multi-port valve assembly, according to one or more embodiments of present disclosure.
Figure 6:
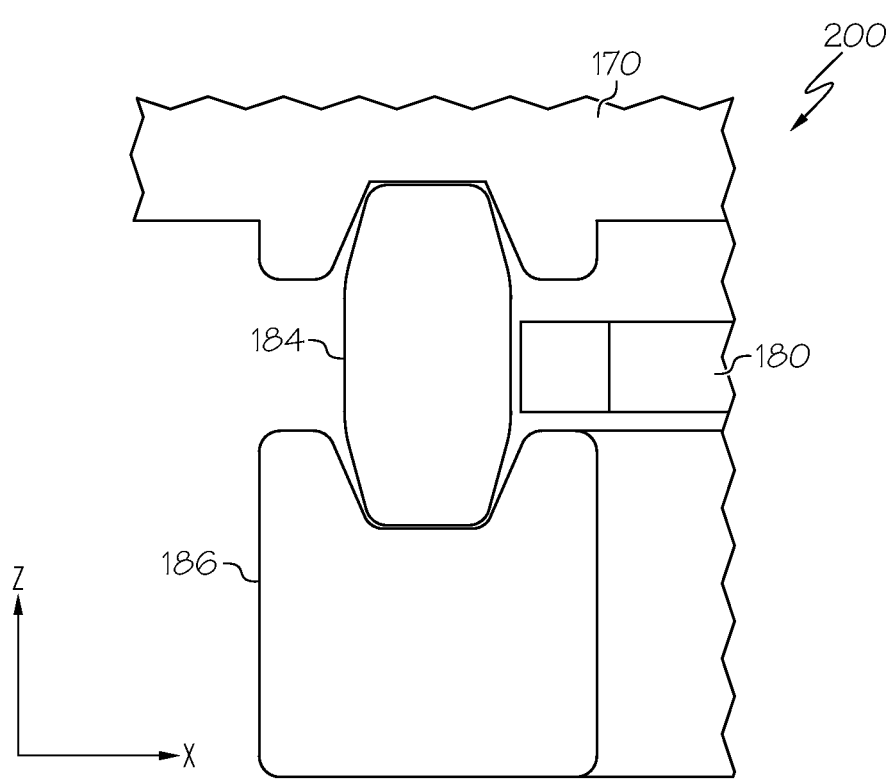
FIG. 6 schematically depicts a cross-sectional view of the bearing assembly of FIG. 5, according to one or more embodiments of present disclosure.
Figure 7:
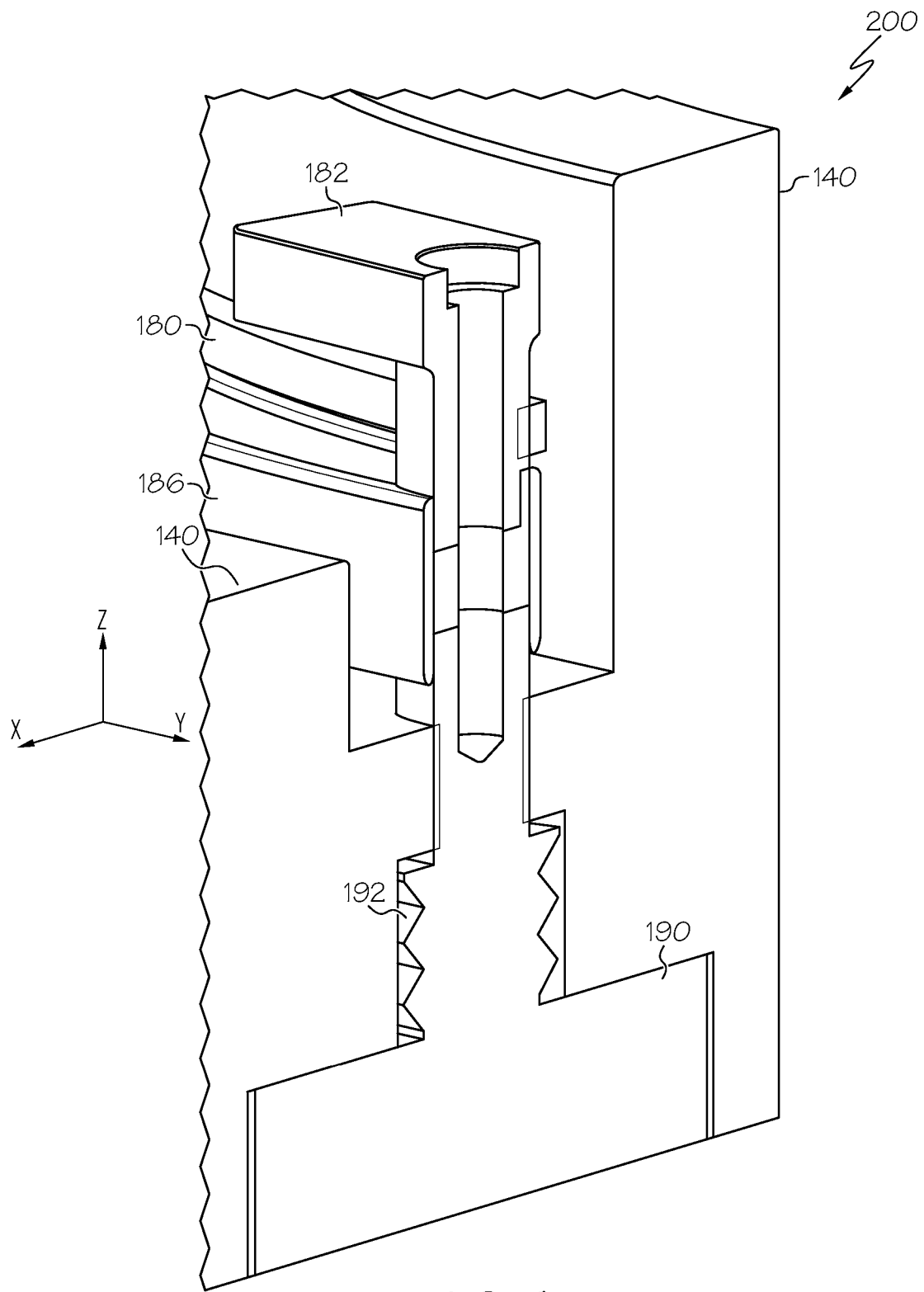
FIG. 7 schematically depicts a cut-away view of the bearing assembly of FIG. 5, according to one or more embodiments of present disclosure.

Referring now to FIGS. 5-7, in one embodiment, the bearing assembly 200 comprises a track 186 and a carriage 180 comprising wheels 184. The wheels 184 may be coupled to the carriage 180 such that the wheels 184 may turn and allow for movement of the carriage 180. FIG. 5 shows a cut-away view of an embodiment of such a bearing assembly 200 comprising wheels 184 on a track 186. The wheels 184 may rest in direct contact with the track 186. The track 186 and carriage 180 may be circular, and define a circular range of motion of the wheels 184. The bearing assembly 200 may further comprise one or more plate attaching members 182 which may be mechanically coupled to the movable seal plate 170 (not shown in FIG. 5) and translate motion of the sealing actuator to the movable seal plate 170.

Referring now to FIG. 6, a cross-sectional view through the wheel section of the bearing assembly 200 of FIG. 5 is shown. The wheel 184 may be coupled to the carriage 180 such that the wheel 184 is free to rotate and move in the direction of the track 186, which may be circular. The wheel 184 may be in contact with and between the track 186 and the movable seal plate 170. The wheels 184 may allow for free movement of the movable seal plate 170 in a rotational direction relative to the track 186.

Referring now to FIG. 7, a cut-away view of the bearing assembly 200 of FIG. 5 is shown which shows a plate attaching member 182. The plate attaching members 182 may be mechanically coupled to the track 186 and the track 186 may be mechanically coupled to an actuator coupling attachment 190. In one embodiment, the actuator coupling attachment 190 may comprise the sealing actuator. For example, the actuator coupling attachment 190 may be a pneumatic actuator that is capable of causing movement in the z-axis direction of the plate attaching member 182, carriage 180, track 186, and causing movement in the z-axis direction of the movable seal plate 170. The actuator coupling attachment 190 may operate as a vacuum seal to seal the vacuum portion of the chamber from the surrounding atmosphere. In some embodiments, the actuator coupling attachment 190 may comprise bellows 192. The bellows 192 may serve to separate the vacuum portion of the chamber from the surrounding atmosphere region 122 of the plasma processing chamber 110 when the actuator coupling attachment 190 moves in the z-axis direction.

Figure 8:
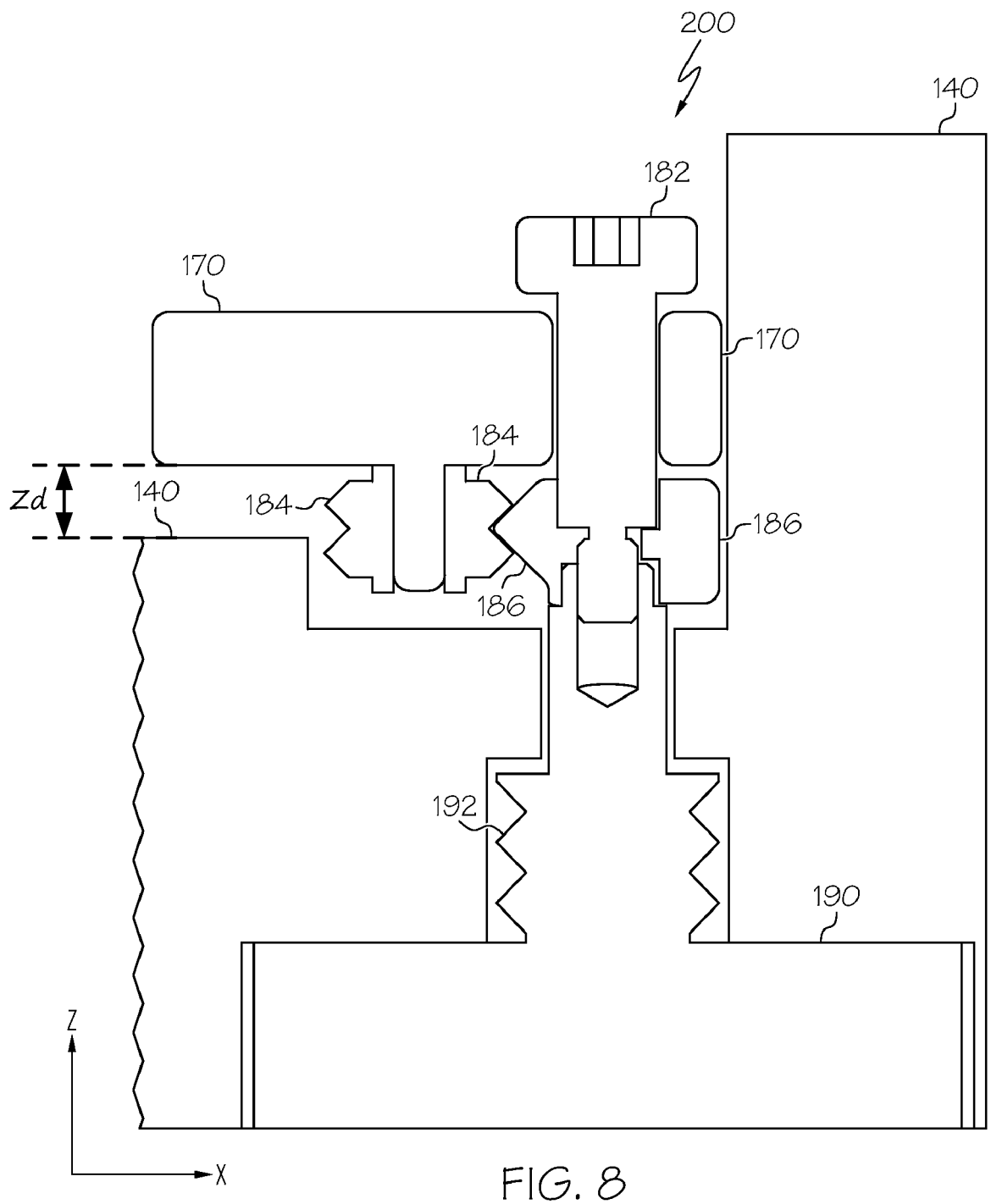
FIG. 8 schematically depicts a cross-sectional view of a bearing assembly of a multi-port valve assembly, according to one or more embodiments of present disclosure.

Referring now to FIG. 8, a cross sectional view of another embodiment of a bearing assembly 200 is shown. In such an embodiment, the bearing assembly 200 may comprise wheels 184 which are oriented in the transverse direction with respect to the track 186. The bearing assembly 200 may comprise a plate attaching member 182 and actuator coupling attachment 190 which are coupled to the track 186, respectively. In the embodiment of FIG. 8, the wheels 184 may be grooved to match a contoured track 186. The wheels 184 may be coupled to the movable seal plate 170 directly. FIG. 8 shows the plate attaching member 182 coupled to the movable seal plate 170, which allows for the plate attaching members 182 to translate movement to the movable seal plate 170. In such an embodiment, the track 186 and plate attaching member 182 remain stationary while the movable seal plate 170 rotates on the wheels 184. The plate attaching member 182 does not actuate movement of the seal plate 170 in the transverse direction, but does actuate movement of the seal plate 170 in the sealing direction when the actuator coupling attachment 190 is moved in the z-axis direction by the sealing actuator, such as a pneumatic actuator.

Figure 9:
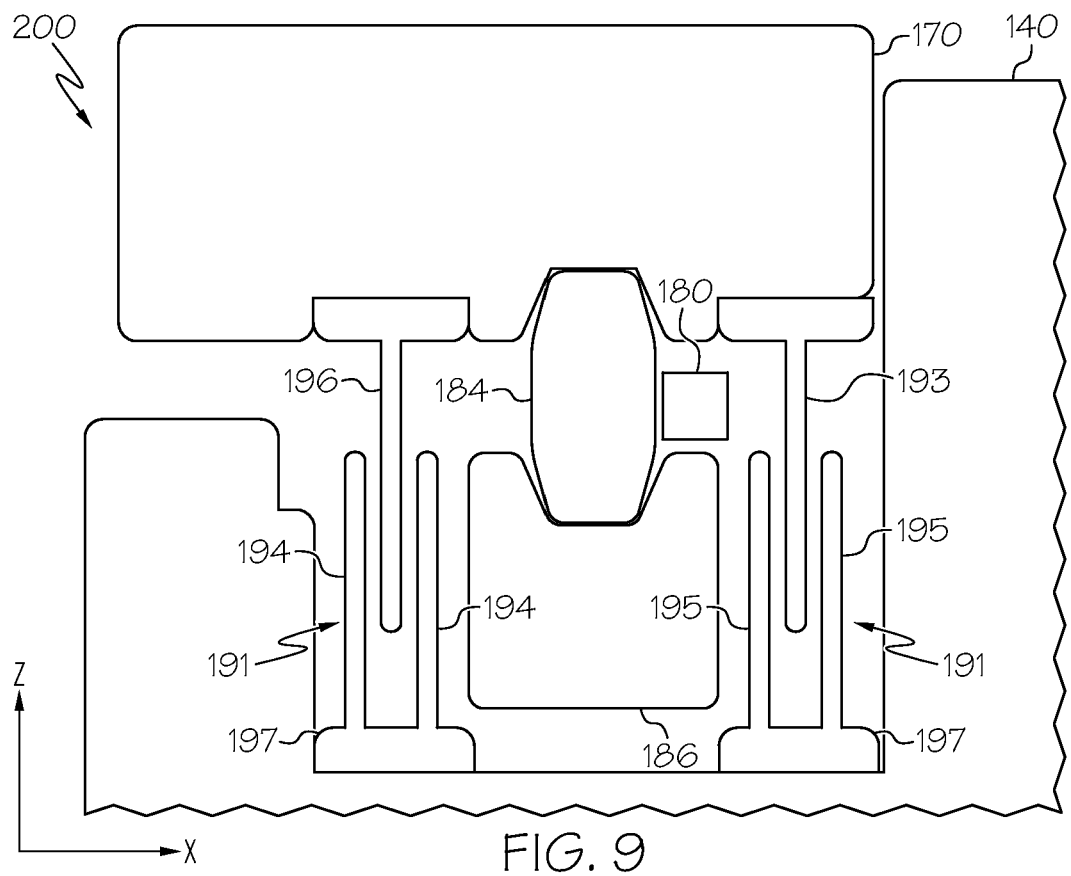
FIG. 9 schematically depicts a cross-sectional view of a bearing assembly of a multi-port valve assembly, according to one or more embodiments of present disclosure.

Referring now to FIG. 9, another embodiment of the multi-port valve assembly 160 is shown. In some embodiments, the multi-port valve assembly 160 may comprise a labyrinth design 191 comprising interleaved sealing extensions 193, 194, 195, 196. In one embodiment, at least one sealing extension 193, 196 may emanate from the movable seal plate 170 and at least one sealing extension 194, 195 may emanate from a chamber member 197 opposite the sealing surface of the movable seal plate 170. However, any number of sealing extensions 193, 194, 195, 196 may emanate from either a chamber member 197 or movable seal plate 170. In one embodiment, the multi-port valve assembly 160 may comprise the labyrinth design 191 on each side of the wheels 184. The labyrinth design 191 may be operable to obstruct the passage of particles from the interior region 122 of the plasma processing chamber 110 to the exterior of the plasma processing chamber 110 and the passage of particles from the exterior of the plasma processing chamber 110 to the interior region 122 of the plasma processing chamber 110.

In one embodiment of the plasma processing device 100 comprising a labyrinth design 191, the sealing actuator may actuate movement of the movable seal plate 170, carriage 180, wheels 184, track 186, sealing extension 196, and sealing extension 193 in the sealing direction. The vacuum connection wall 140, sealing extensions 194, 195, and chamber members 197 may remain stationary.

In one embodiment, at least a portion of the multi-port valve assembly 160 may be electrostatically charged. Electrostatically charged, as used herein, refers to an electrical charge running through the section of the multi-port valve assembly 160. For example, in one embodiment, at least one of the interleaved sealing extensions 193, 194, 195, 196 may be electrostatically charged. The charge may serve to attract or detract particles. For example, the charge may be operable to obstruct the passage of particles from the interior region 122 of the plasma processing chamber 110 to the exterior of the plasma processing chamber 110 and the passage of particles from the exterior of the plasma processing chamber 110 to the interior region 122 of the plasma processing chamber 110.

Referring now to FIG. 10, in one embodiment, the transverse actuator may comprise a mechanical crank 164. The mechanical crank 164 may be operable to move the seal plate 170 in the transverse direction. The mechanical crank 164 may comprise a crank shaft 162 coupled to the movable seal plate 170 at a coupling point 165. The coupling point 165 may mechanically couple the mechanical crank 164 to the movable seal plate 170 while allowing the coupling point 165 to slide along the edge of the movable seal plate 170. The crank shaft 162 may rotate to move the movable seal plate 170 in the transverse direction. The crank shaft 162 may rotate causing coupling point 165 to slide along the edge of movable seal plate 170 and translate movement to the movable seal plate 170. In one embodiment, the crank shaft 162 may extend from the exterior of the plasma processing chamber 110 to the interior region 122 of the plasma processing chamber 110. The rotation of the crank shaft 162 may be controlled by a motor or other mechanical means.

In another embodiment, the transverse actuator may comprise a magnetic system. For example, the seal plate 170 may comprise a first magnetic component which may be magnetically coupled to a second magnetic component that is positioned outside of the plasma processing chamber 110. The movement of the second magnetic component may actuate motion of the movable seal plate 170 in the transverse direction.

In another embodiment, the multi-port valve assembly 160 may comprise a ferro-fluidic seal 174. FIG. 11 shows a cross sectional view of an embodiment of a ferro-fluidic seal 174. The ferro-fluidic seal 174 may comprise a ferro-fluid 172. In one embodiment, the movable seal plate 170 may comprise a plate member 178, and the ferro-fluid 172 may be positioned between the plate member 178 of the movable seal plate 170 and a chamber member 146 opposite the sealing surface of the movable seal plate 170. The ferro-fluidic seal 174 may be a magnetic liquid sealing system that may be used to rotate the movable seal plate 170 while maintaining a hermetic seal by means of a physical barrier in the form of the ferro-fluid 172.

In another embodiment, the multi-port valve assembly 160 may comprise a magnetic actuator system. The magnetic actuator system may be operable to levitate the movable seal plate 170. FIG. 12 shows a cross section view of an embodiment of a levitating seal plate 170. The seal plate 170 may comprise a plate member 176 that is contoured to the shape of the vacuum connection wall 140. The movable seal plate 170 may comprise a first magnetic component. The first magnetic component may be magnetically coupled to a second magnetic component that is positioned outside of the plasma processing chamber 110. The magnetic system may actuate the movement of the movable seal plate 170 in the transverse and sealing directions.

In such one embodiment, the transverse actuator may comprise a magnetic actuator system and the sealing actuator may comprise a magnetic actuator system. The transverse actuator and the sealing actuator may comprise the same magnetic actuator system. In the embodiment shown in FIG. 12, the magnetic actuator system is operable to levitate the movable seal plate 170 and actuate its motion from the closed to open states and vice versa.

Figure 13A:
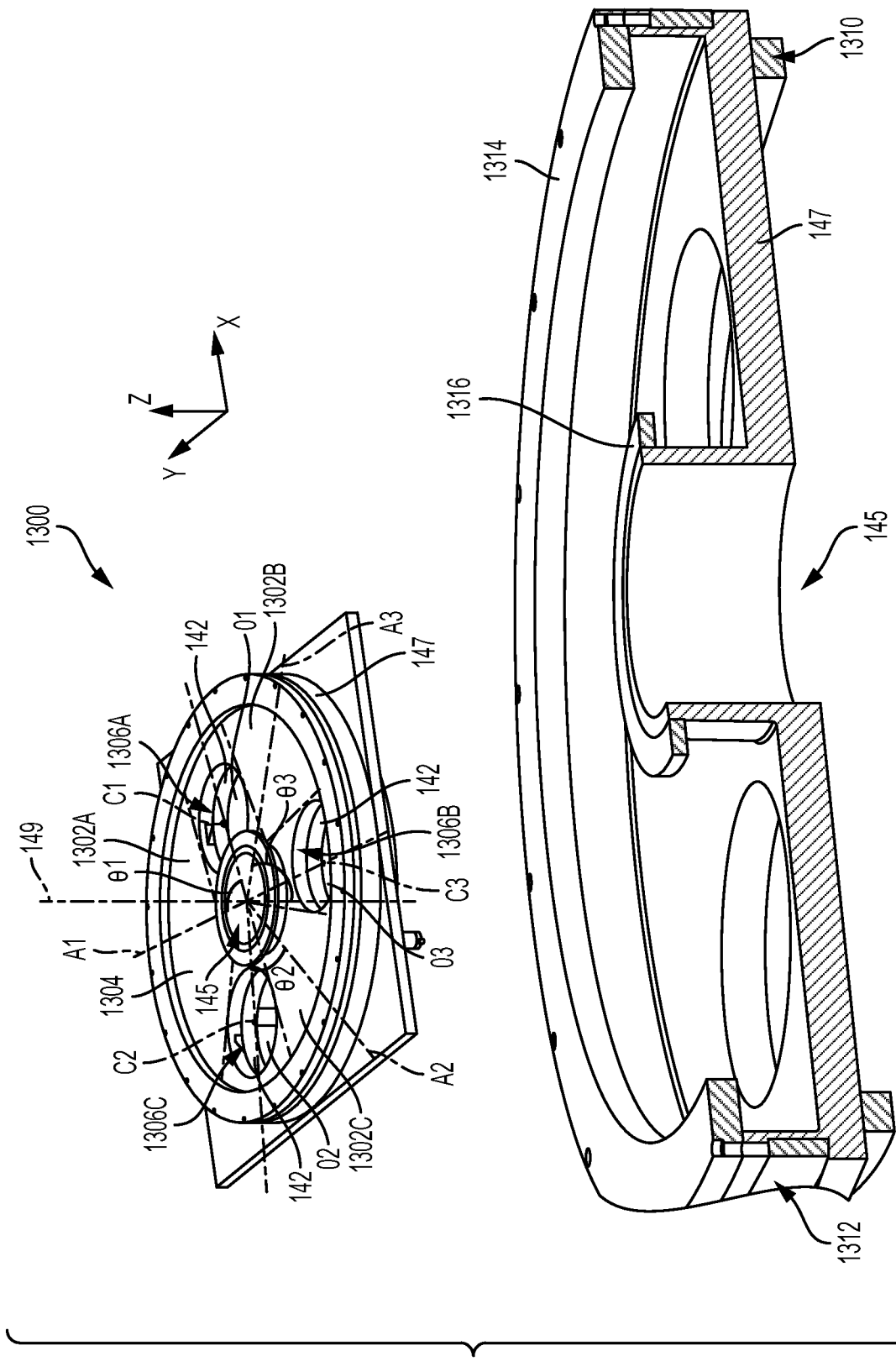
FIG. 13A shows an isometric view of a multi-port valve assembly, according to one or more embodiments of present disclosure.

FIG. 13A includes an isometric view of a multi-port valve assembly 1300. The multi-port valve assembly 1300 is fitted at the bottom of the plasma processing chamber 110 (FIG. 1) in the same manner in which the multi-port valve assembly 160 (FIG. 2) is fitted. For example, the multi-port valve assembly 1300 is screwed and/or bolted to the side walls 116 of the plasma processing chamber 160 and any space between the side walls 116 and the multi-port valve assembly 1300 is sealed. As another example, the multi-port valve assembly 1300 is welded or chemically bonded or both to the side walls 116.

The multi-port valve assembly 1300 includes a top plate 1304 and the bottom plate 147. The top plate 1304 is moveable with respect to the bottom plate 147 in a manner in which the moveable seal plate 170 (FIG. 3) is moveable with respect to the bottom plate 147. For example, the top plate 1304 rotates or levitates with respect to the bottom plate 147. As another example, mechanism used in FIGS. 5 and 6 or FIGS. 7 and 8 or FIG. 9 is used to support the top plate 1304 with respect to the bottom plate 147.

The top plate 1304 includes multiple openings 1306A, 1306B, and 1306C, which are of the same shape as that of the multiple openings of the bottom plate 147. The opening 1306A is between a portion 1302A and a portion 1302B and the opening 1306B is between the portion 1302B and a portion 1302C. The opening 1306C is between the portion 1302C and the portion 1302A.

The portion 1302A is located between a portion of the feed through port 145 of the multi-port valve assembly 1300, the openings 1306A and 1306C, and a portion of a peripheral edge of the top plate 1304. Similarly, the portion 1302B is located between a portion of the feed through port 145, the openings 1306A and 1306B, and a portion of a peripheral edge of the top plate 1304. Also, the portion 1302C is located between a portion of the feed through port 145, the openings 1306B and 1306C, and a portion of a peripheral edge of the top plate 1304.

An edge portion 1310 of the bottom plate 147 includes a coil that is along the edge portion 1310. For example, the coil within the edge portion 1310 is located within the entire edge portion 1310 along a circumference of the bottom plate 147. Moreover, an edge portion 1312 of the bottom plate 147 includes a coil that is along the edge portion 1312. For example, the coil within the edge portion 1312 is located within the entire edge portion 1312 along a circumference of the bottom plate 147. It should be noted that the edge portion 1312 is located above the edge portion 1310. A removable seal plate 1314 is located above the top plate 1304 and the bottom plate 147 when the top plate 1304 is located above the bottom plate 147. Also, a removable chamber liner support 1316 surrounds the feed through port 145.

When a current passes through the coil within the edge portion 1310, an electric field and a magnetic field are generated surrounding the coil, and the magnetic field is oriented in the vertical direction, e.g., along the z-axis, pointing upward, pointing downward, etc. Moreover, when a current passes through the coil within the edge portion 1312, an electric field and a magnetic field are generated surrounding the coil, and the magnetic field is oriented in the transverse direction, e.g., along an x-y plane between the x-axis and the y-axis, etc. The magnetic fields oriented in the transverse direction facilitate a change in the angles $\theta_1$, $\theta_2$, and $\theta_3$ simultaneously. The angle $\theta_1$ is formed between a transverse axis that passes through the center C1 of the opening O1 of the valve port 142 and the axis A1 that passes through a center of mass of the multi-port valve assembly 1300. The axis A1 bisects the portion 1302A of the top plate 1304. Moreover, the angle $\theta_2$ is formed between a transverse axis that passes through the center C2 of the opening O2 of the valve port 142 and the axis A2 that passes through the center of mass of the multi-port valve assembly 1300. The axis A2 bisects the portion 1302C of the top plate 1304. Also, an angle $\theta_3$ is formed between a transverse axis that passes through the center C3 of an opening O3 of the valve port 142 and the axis A3 that passes through the center of mass of the multi-port valve assembly 1300. The axis A3 bisects the portion 1302B of the top plate 1304.

In one embodiment, the angles θ1, θ2, and θ3 are controlled by the valve controller, which is further described below, so that the portions 1302A, 1302B, and 1302C are in the partially open, closed, or open positions with respect to the openings of the valve ports 142.

In an embodiment, the angles θ1, θ2, and θ3 are controlled by the valve controller such that at all times, the angles θ1, θ2, and θ3 are equal.

The embodiment of FIG. 13A is shown for use of three vacuum pumps 150. In case two vacuum pumps 150 are used, the top plate 1304 includes two openings that are spaced apart from each other. For example, both the openings are located at an angle of 180 degrees on the top plate 1304 and the bottom plate 147 includes two openings that are oriented at 180 degrees with respect to each other.

In one embodiment, the multi-port valve assembly 1300 is a part of the plasma processing chamber 110.

Figure 13B:
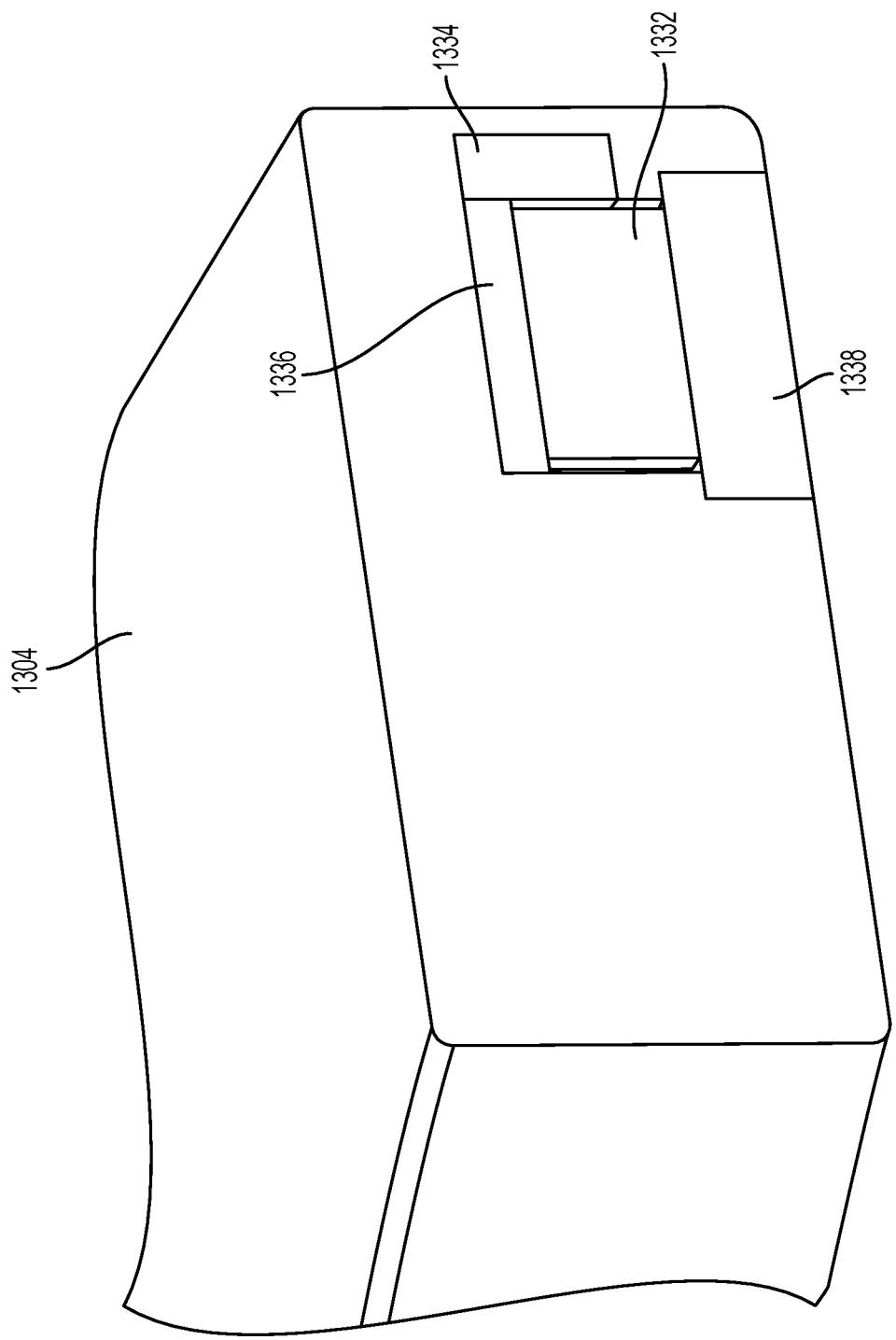
FIG. 13B is an isometric view of a portion of a top plate of the multi-port valve assembly of FIG. 13A, according to one or more embodiments of present disclosure.

FIG. 13B is an isometric view of an embodiment of a portion of the top plate 1304. The top plate 1304 includes one or more magnets 1332, e.g., permanent magnets, neodymium magnets, rare earth metal magnets, etc., for levitation, e.g., movement of the top plate 1304 along the z-axis, etc. For example, the top plate 1304 includes a set of magnets, e.g., 2 magnets, 4 magnets, etc. The one or more magnets 1332 generate corresponding one or more magnetic fields that are oriented in the vertical direction for facilitating levitation of the top plate 1304. The top plate 1304 further includes one or more magnets 1334, e.g., permanent magnets, neodymium magnets, rare earth metal magnets, etc., for rotation of the top plate 1304 along the x-y plane for throttling a flow of materials from the plasma processing chamber 110 to the vacuum pumps 150. For example, the top plate 1304 includes a series of magnets along a radial region of the top plate 1304 for rotation of the top plate 1304. The radial region is a region within a pre-determined distance from a circumference of the top plate 1304. The one or more magnets 1334 generate corresponding one or more magnetic fields that are oriented in the transverse direction for facilitating rotation of the top plate 1304. The top plate 1304 further includes a metallic shield 1336 to reduce chances of magnetic fields generated by the one or more magnets 1332 and 1334 to interfere with processing of the substrate 112 (FIG. 1) within the plasma processing chamber 110. A bonded cover 1338 of the top plate 1304 provides a cover to the one or more magnets 1332 and 1334 within the top plate 1304. In one embodiment, each magnet 1332 is of a cylindrical shape and each magnet 1334 is of an arc shape. In an embodiment, a magnet, as used herein, is of any other shape, e.g., bar shape, horseshoe shape, disc shape, etc.

When the magnetic field generated by the coil located within the edge portion 1310 (FIG. 13A) interferes with the magnetic field generated by the one or more magnets 1332, the top plate 1304 levitates along the z-axis with respect to the bottom plate 147 to seal or unseal the openings of the vacuum ports 142 (FIG. 13A). Moreover, when the magnetic field generated by the coil located within the edge portion 1312 (FIG. 13A) interferes with the magnetic field generated by the one or more magnets 1334, the top plate 1304 rotates along the x-y plane with respect to the bottom plate 147 to open, partially open, or close the openings of the vacuum ports 142.

In one embodiment, the one or more magnets 1334 are equally or unequally spaced from each other. Similarly, in an embodiment, the one or more magnets 1336 are equally or unequally spaced from each other.

In an embodiment, an amount of electric current within the coil located within the edge portion 1312 is controlled by the valve controller, further described below, to control an amount of rotation of the top plate 1304 with respect to the bottom plate 147. For example, the amount of current applied to the coil located within the edge portion 1312 is increased or decreased so that the magnetic field generated by the current applies a force to the top plate 1304 so that an angle formed by a horizontal axis passing through a center of mass of the top plate 1304 and a first one of the one or more magnets 1334 with respect to the x-axis is the same as an angle that was formed by a horizontal axis passing through a center of mass of the top plate 1304 and a second one of the one or more magnets 1334 with respect to the x-axis. The first and second magnets are located adjacent to each other in this example. Moreover, the horizontal axis is an axis located in the x-y plane. As another example, the amount of current applied to the coil located within the edge portion 1312 is increased or decreased so that the magnetic field generated by the current applies a force to the top plate 1304 so that an angle formed by a horizontal axis passing through a center of mass of the top plate 1304 and a position between the first and second magnets with respect to the x-axis is the same as an angle that was formed by a horizontal axis passing through a center of mass of the top plate 1304 and a position between the second magnet and a third magnet with respect to the x-axis. The third magnet is located adjacent to the second magnet and on a side opposite to which the first magnet is located.

In an embodiment, the one or more magnets 1332 and 1334 are located in the moveable seal plate 170 (FIG. 2) to facilitate levitation or rotation of the moveable seal plate 170 with respect to the bottom plate 147. For example, the one or more magnets 1332 and 1334 are located within the lobes 144 (FIG. 3) to facilitate control of movement of the moveable seal plate 170 along the z-axis and along the x-y plane.

In one embodiment, when the lobes 144 (FIG. 2) or the portions 1302A, 1302B, and 1302C are in an open state in which the openings O1, O2, and O3 are not covered partially or completely by the lobes or the portions 1302A, 1302B, and 1302C, such a state of the lobes 144 or the portions 1302A, 1302B, and 1302C is sometimes referred to herein as a non-overlapping state. In the non-overlapping state, there is a maximum amount of flow conductance via each of the openings O1, O2, and O3 compared to flow conductance for an overlapping state and degrees of a partially overlapping state. In an embodiment, when the lobes 144 (FIG. 2) or the portions 1302A, 1302B, and 1302C are in a closed state in which the openings O1, O2, and O3 are completely covered by the lobes or the portions 1302A, 1302B, and 1302C, such a state of the lobes 144 or the portions 1302A, 1302B, and 1302C is sometimes referred to herein as the overlapping state. In the overlapping state, there is no flow conductance or minimal flow conductance from the interior region 122 of the plasma processing chamber 110 to the vacuum pumps 150. In one embodiment, when the lobes 144 (FIG. 2) or the portions 1302A, 1302B, and 1302C are in a partially open state in which the openings O1, O2, and O3 are not completely covered and are not left open by the lobes or the portions 1302A, 1302B, and 1302C, such a state of the lobes 144 or the portions 1302A, 1302B, and 1302C is sometimes referred to herein as the partially overlapping state. In the partially overlapping state, when the angles θ1, θ2, and θ3 change over time, degrees of the partially overlapping state change over time. As the angles θ1, θ2, and θ3 increase, degrees of the partially overlapping state increase, and flow conductance associated with each of the openings O1, O2, and O3 increase. Similarly, as the angles θ1, θ2, and θ3 decrease, degrees of the partially overlapping state decrease, and flow conductance associated with each of the openings O1, O2, and O3 decrease.

In an embodiment, when the lobes 144 or the portions 1302A, 1302B, and 1302C are positioned over the openings O1, O2, and O3 so that the openings are completely covered and sealed by the lobes 144 or the portions 1302A, 1302B, and 1302C, such a state of the lobes 144 or the portions 1302A, 1302B, and 1302C is a sealed state. In an embodiment, when the lobes 144 or the portions 1302A, 1302B, and 1302C are positioned over the openings O1, O2, and O3 so that the openings are not completely covered by the lobes 144 or the portions 1302A, 1302B, and 1302C, and the lobes 144 or the portions 1302A, 1302B, and 1302C are moved in a stepwise fashion, e.g., translated, etc., in a vertical direction along the z-axis, such a state of the lobes 144 or the portions 1302A, 1302B, and 1302C is sometimes referred to herein as degrees of an unsealed state of the lobes 144 or the portions 1302A, 1302B, and 1302C. For example, when the lobes 144 are moved in the vertical direction from a position zd1 on the z-axis to a position zd2 on the z-axis from the bottom plate 147, there is a change in a degree of the unsealed state. The position zd1 is associated with a first degree of the unsealed state and the position zd2 is associated with a second degree of the unsealed state.

In one embodiment, as the lobes 144 or the portions 1302A, 1302B, and 1302C move from being open to being closed, there is a decrease in flow conductance at the openings O1, O2, and O3. Similarly, as the lobes 144 or the portions 1302A, 1302B, and 1302C move from the being closed to being open, there is an increase in flow conductance at the openings O1, O2, and O3. In an embodiment, as the lobes 144 or the portions 1302A, 1302B, and 1302C move from the unsealed state to the sealed state, there is a decrease in flow conductance at the openings O1, O2, and O3. Moreover, as the lobes 144 or the portions 1302A, 1302B, and 1302C move from the sealed state to the unsealed state, there is an increase in flow conductance at the openings O1, O2, and O3.

Figure 14:
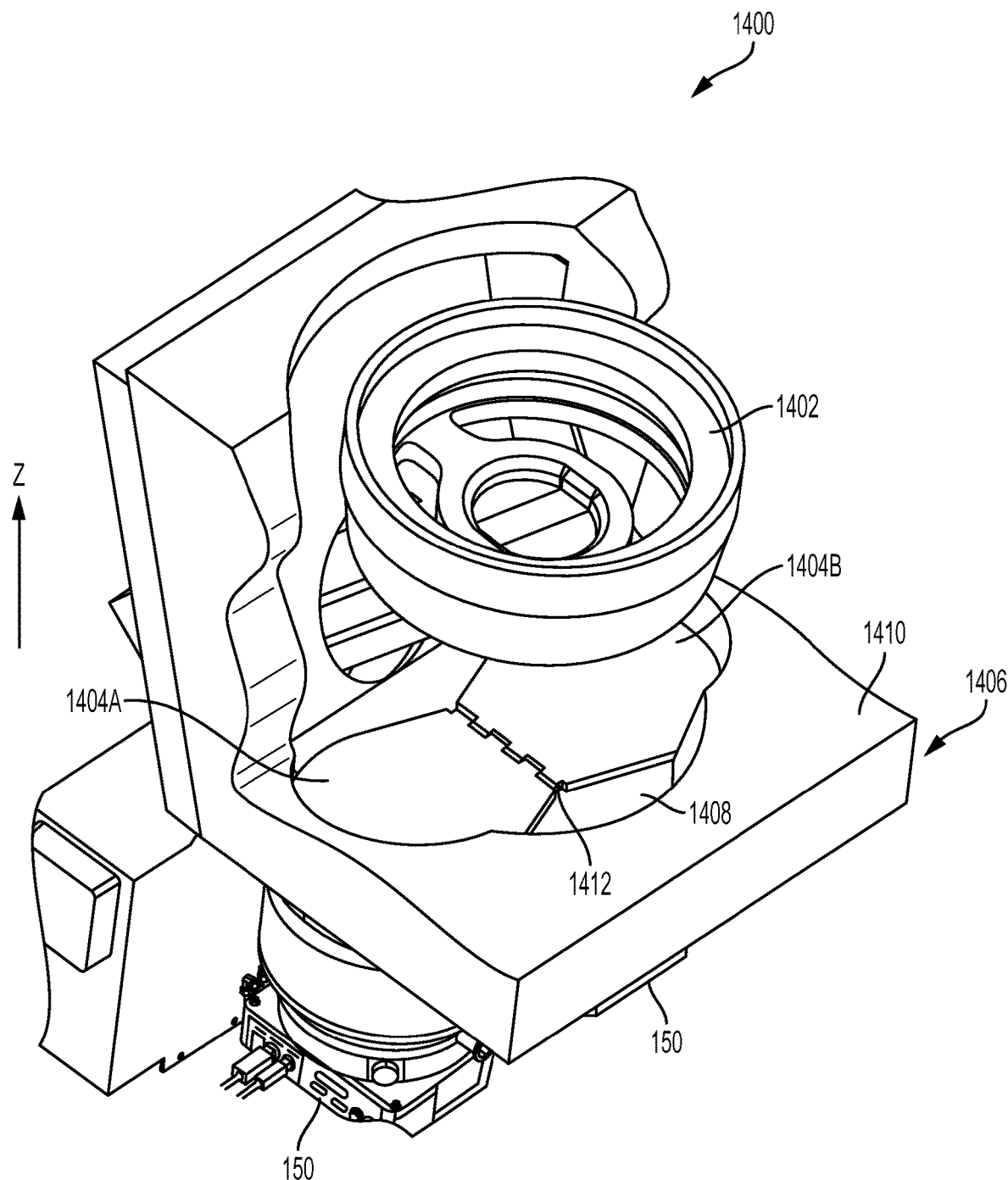
FIG. 14 is an isometric view of a portion of a plasma processing chamber, according to one or more embodiments of present disclosure.

FIG. 14 is an isometric view of an embodiment of a portion 1400 of a plasma processing chamber. The portion 1400 includes a pedestal 1402, e.g., a wafer stage, a chuck, etc., on which the substrate 112 (FIG. 1) is placed for processing the substrate 112. Below the pedestal 1402, is a multi-port valve assembly 1406. The multi-port valve assembly 1406 includes a vacuum connection wall 1410, a plurality of flaps 1404A and 1404B, and a metal plate 1408 having openings, one for each flap 1404A and 1404B.

The flaps 1404A and 1404B are hinged with respect to each other and rotate along the z-axis about a hinge 1412. For example, a motor, e.g., a stepper motor, a servo motor, etc., is connected to one or more connection links, e.g., shafts, or gears, or a combination thereof, etc., that move in the vertical direction with movement of a rotor of the motor. In one embodiment, the motor and the one or more connection links and a driver, e.g., one or more transistors, etc., for driving the motor are parts of the actuator. The one or more connection links are in contact with the flap 1404A or the flap 1404B. The movement of the one or more connection links in the upward direction opens the flap 1404A or the flap 1404B, and the movement of the one or more connection links in the downward direction closes the flap 1404A or the flap 1404B. The flaps 1404A and 1404B are opened and closed to change an amount of flow conductance between an interior of the plasma chamber and the vacuum pumps 150.

Each flap 1404A and 1404B when closed or sealed covers an opening in the metal plate 1408. For example, the flap 1404A covers the opening in the metal plate 1408 and the opening lies between the vacuum pump 150 and an interior region of the plasma processing chamber in which the portion 1400 is located. As another example, the flap 1404B covers another opening in the metal plate 1408 and the opening lies between the vacuum pump 150 and the interior region of the plasma processing chamber in which the portion 1400 is located.

In one embodiment, one motor is connected via the connection links to the flaps 1404A and 1404B to seal, unseal, open, close, or partially open the flaps 1404A and 1404B simultaneously. For example, the flap 1404A is open with respect to one of the openings by an amount, e.g., angle formed with respect to the opening, degrees formed with respect to the opening, etc., and the amount is the same as an amount by which the flap 1404B is open with respect to another one of the openings. The opening of the flaps 1404A and 1404B by the same amount results in a simultaneous change in a flow conductance associated with the openings. The motor is controlled by the valve controller. For example, the valve controller sends a command signal to a driver, which generates a current to rotate a rotor of the motor. The rotor rotates to move the one or more connection links to seal or unseal the flaps 1404A and 1404B simultaneously.

In one embodiment, the flaps 1404A and 1404B and the hinge 1412 are sometimes referred to herein as a plate, and the flaps 1404A and 1404B are portions of the plate.

Figure 15A:
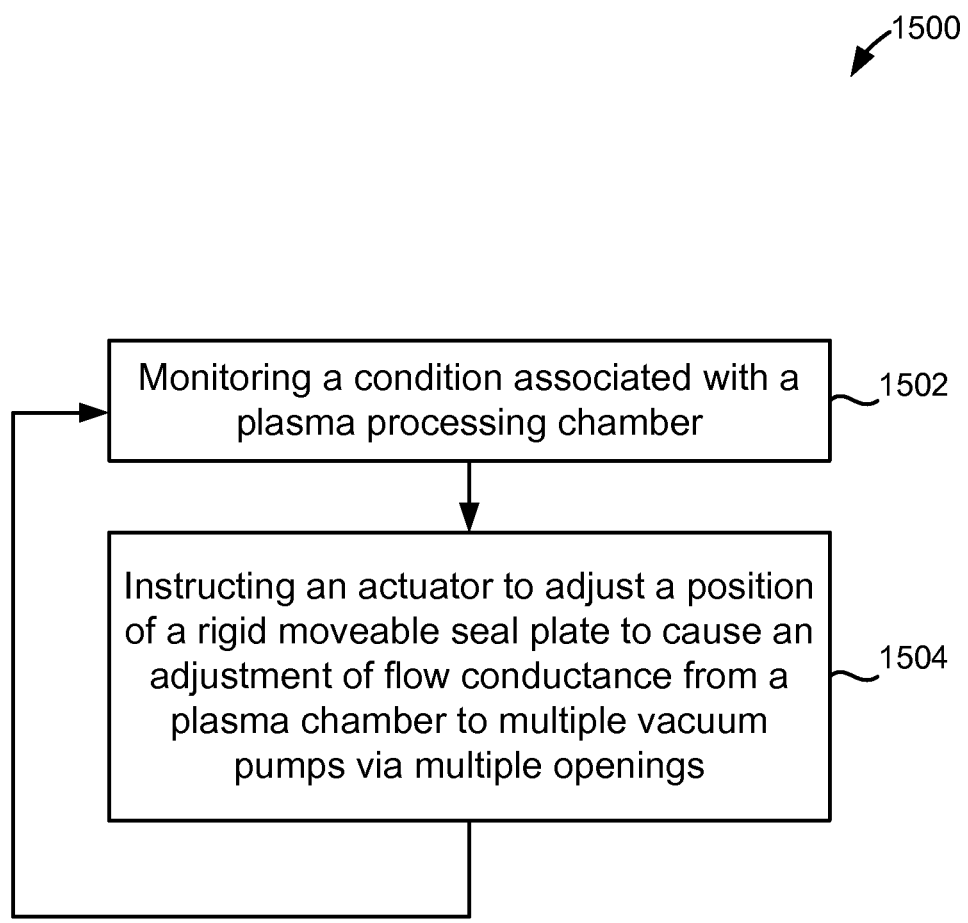
FIG. 15A is a flowchart of a method for illustrating use of a valve controller for adjusting flow conductance associated with the plasma processing device of FIG. 1, according to one or more embodiments of present disclosure.

FIG. 15A is a flowchart of an embodiment of a method 1500 for illustrating use of the valve controller for adjusting flow conductance associated with the plasma processing chamber 110 (FIG. 1). The method 1500 is executed by the valve controller. Examples of a controller, as used herein, include a processor and a memory device. As used herein, a processor is an application specific integrated circuit, a programmable logic device, a microprocessor, or a central processing unit, etc. Examples of a memory device include a random access memory (RAM), a flash memory, a read-only memory, a disk array, a compact-disc, a hard disk, etc.

The method 1500 includes an operation 1502 of monitoring a condition associated with the plasma processing chamber 110. For example, a pressure sensor is used to sense a pressure within the plasma processing chamber 110. The pressure sensor is located within the interior region 122 (FIG. 1). In an embodiment, a portion of the pressure sensor is located within the interior region 122 and the remaining portion of the pressure sensor is located outside the interior region 122. As another example, a flow rate of flow of materials, e.g., remnants of plasma processing, gases, plasma, etc., flowing through the vacuum ports 142 (FIG. 3) from the interior region 122 (FIG. 1) to the vacuum pumps 150 (FIG. 1), is measured by a flow rate sensor, e.g., a flow meter, etc.

The condition that is monitored is provided to the valve controller. Upon receiving the condition, in an operation 1504, the valve controller instructs an actuator that is connected to the valve controller to adjust a position of the rigid moveable seal plate 170 (FIG. 3) or the top plate 1304 (FIG. 13A) to cause an adjustment of flow conductance, e.g., flow rate, etc., from the plasma processing chamber 110 to the vacuum pumps 150 via the openings O1, O2, and O3 of the vacuum ports 142. For example, the valve controller sends a signal to the actuator to move the rigid moveable seal plate 170 having the lobes 144 or the top plate 1304 having the portions 1302A, 1302B, and 1302C in the vertical direction, e.g., along the z-axis, etc., either up or down to adjust the flow conductance. The lobes 144 that are integrated into the moveable seal plate 170 facilitate achieving simultaneous movement of the lobes 144 and the portions 1302A, 1302B, and 1302C that are integrated into the top plate 1304 facilitate achieving simultaneous movement of the portions 1302A, 1302B, and 1302C when controlled by the valve controller via the actuator. When the lobes 144 or the portions 1302A, 1302B, and 1302C are moved at the same time, there is a simultaneous change in flow conductance via each of the openings O1, O2, and O3 of the bottom plate 147 (FIG. 2). For example, a change in flow conductance from the interior region 122 (FIG. 1) via the opening O1 to a first vacuum pump 150 interfaced with the opening O1 is the same as a change in flow conductance from the interior region 122 via the opening O2 to a second vacuum pump 150 interfaced with the opening O2 and a change in flow conductance from the interior region 122 via the opening O3 to a third vacuum pump 150 interfaced with the opening O3. As another example, the valve controller sends a signal to the actuator to move the rigid moveable seal plate 170 or the top plate 1304 in the transverse direction to open, or partially open, or close the openings O1, O2, and O3 associate with the vacuum ports 142. The operation 1502 repeats after the operation 1504. In an embodiment, the operation 1502 is performed simultaneously with the operation 1504.

In one embodiment, the flow conductance is associated with all the vacuum ports 142. For example, a flow rate sensor is placed within the interior region 122 or outside the interior region 122 to measure a flow rate of flow via the opening O1 associated with one of the vacuum ports 142, another flow rate sensor is placed within the interior region 122 or outside the interior region 122 to measure a flow rate of flow via the opening O2 associated with another one of the vacuum ports 142, and yet another flow rate sensor is placed within the interior region 122 or outside the interior region 122 to measure a flow rate of flow via the opening O3 associated with yet another one of the vacuum ports 142. The valve controller receives the flow rates associated with the openings O1, O2, and O3 associated with the vacuum ports 142 and sums the flow rates to achieve the flow conductance associated with the plasma processing chamber 110 or with the three vacuum ports 142.

In an embodiment, the method of FIG. 15A is applicable to the multi-port valve assembly 1406 of FIG. 14. For example, after monitoring, in the operation 1502, the condition associated with the plasma processing chamber illustrated using FIG. 14, the valve controller instructs the actuator, e.g., a driver that is connected to a motor, etc., to actuate the flaps 1404A and 1404B (FIG. 14) in a vertical direction by rotating the flaps about the hinge 1412 (FIG. 14).

Figure 15B:
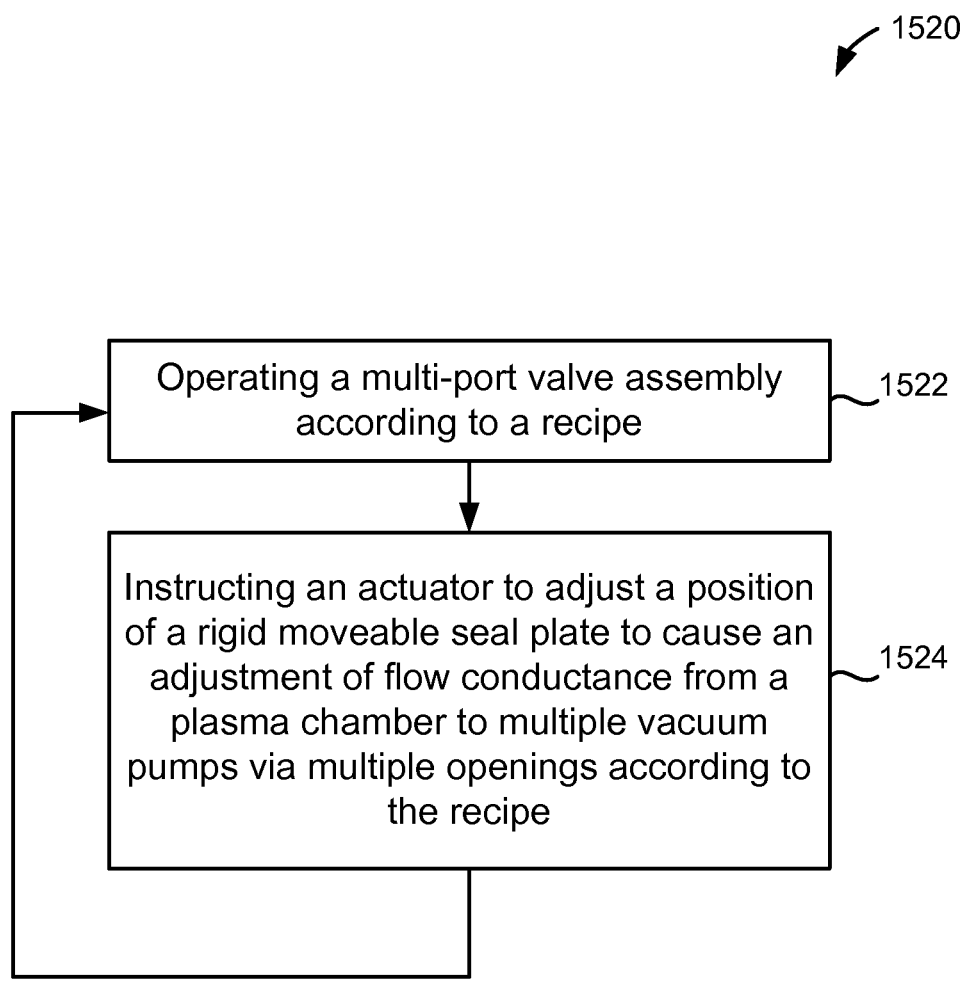
FIG. 15B is a flowchart of a method for operating the multi-port valve assembly of FIG. 2 or of FIG. 13A according to a recipe, according to one or more embodiments of present disclosure.

FIG. 15B is a flowchart of an embodiment of a method 1520 for operating a multi-port valve assembly, e.g., the multi-port valve assembly 160 (FIG. 2), the multi-port valve assembly 1300 (FIG. 13A), etc., according to a recipe. The recipe includes one or more parameters, e.g., pressure, temperature, gap between upper and lower electrodes, flow rate of one or more process gases that flow into the plasma processing chamber 110, one or more frequencies of one or more RF signals that are supplied to the plasma processing chamber 110, one or more power level of the one or more RF signals, etc., for processing the substrate 112. Examples of various processes being performed on the substrate 112 include depositing materials on the substrate 112, etching the substrate 112 or a layer deposited on the substrate 112, cleaning the substrate 112, etc. In one embodiment, the valve controller receives the recipe from a host controller coupled to the valve controller. For example, the valve controller receives an operating pressure or an operating flow conductance to be maintained within the interior region 122 (FIG. 1) from the host controller.

The method 1520 includes an operation 1522 of operating the multi-port valve assembly according to the recipe. For example, the valve controller controls the actuator to further control movement of the rigid moveable seal plate 170 (FIG. 3) or the top plate (FIG. 13A) so that the operating pressure and/or the operating flow conductance is maintained. As another example, the valve controller stores a look-up table that has a correspondence between amounts by which openings of the vacuum ports 142 are open and the operating pressure and/or the operating flow conductance. The valve controller identifies from the look-up table the amounts by which openings of the vacuum ports 142 are open based on the operating pressure and/or the operating flow conductance. The valve controller sends a signal to the actuator to achieve the amounts by which openings of the vacuum ports 142 are open.

The method 1502 further includes an operation 1524 of instructing the actuator to adjust a position of the rigid moveable seal plate 170 or the top plate (FIG. 13A) to cause an adjustment of flow conductance from the interior region 122 to the vacuum pumps 150 via openings of the vacuum ports 142. For example, the valve controller identifies from the look-up table that the amounts by which the vacuum ports 142 are open are to be modified according to a change in the operating pressure and/or the operating flow conductance. To achieve the modified amounts, the vacuum controller sends a signal to the actuator to open, or close, or further partially open, and/or further partially close the openings of the vacuum ports 142.

In an embodiment, the method 1520 of FIG. 15B is applicable to the multi-port valve assembly 1406 of FIG. 14. For example, after performing the operation 1522 of operating the multi-port valve assembly 1406 according to the recipe, the valve controller instructs the actuator, e.g., a driver that is connected to a motor, etc., to rotate the flaps 1404A and 1404B (FIG. 14) about the hinge 1412 (FIG. 14) to further adjust a flow conductance. The flow conductance is a conductance of flow of materials from the plasma chamber illustrated in FIG. 14 via the openings in the metal plate 1408 (FIG. 14) to the vacuum pumps 150 (FIG. 14).

Figure 16A:
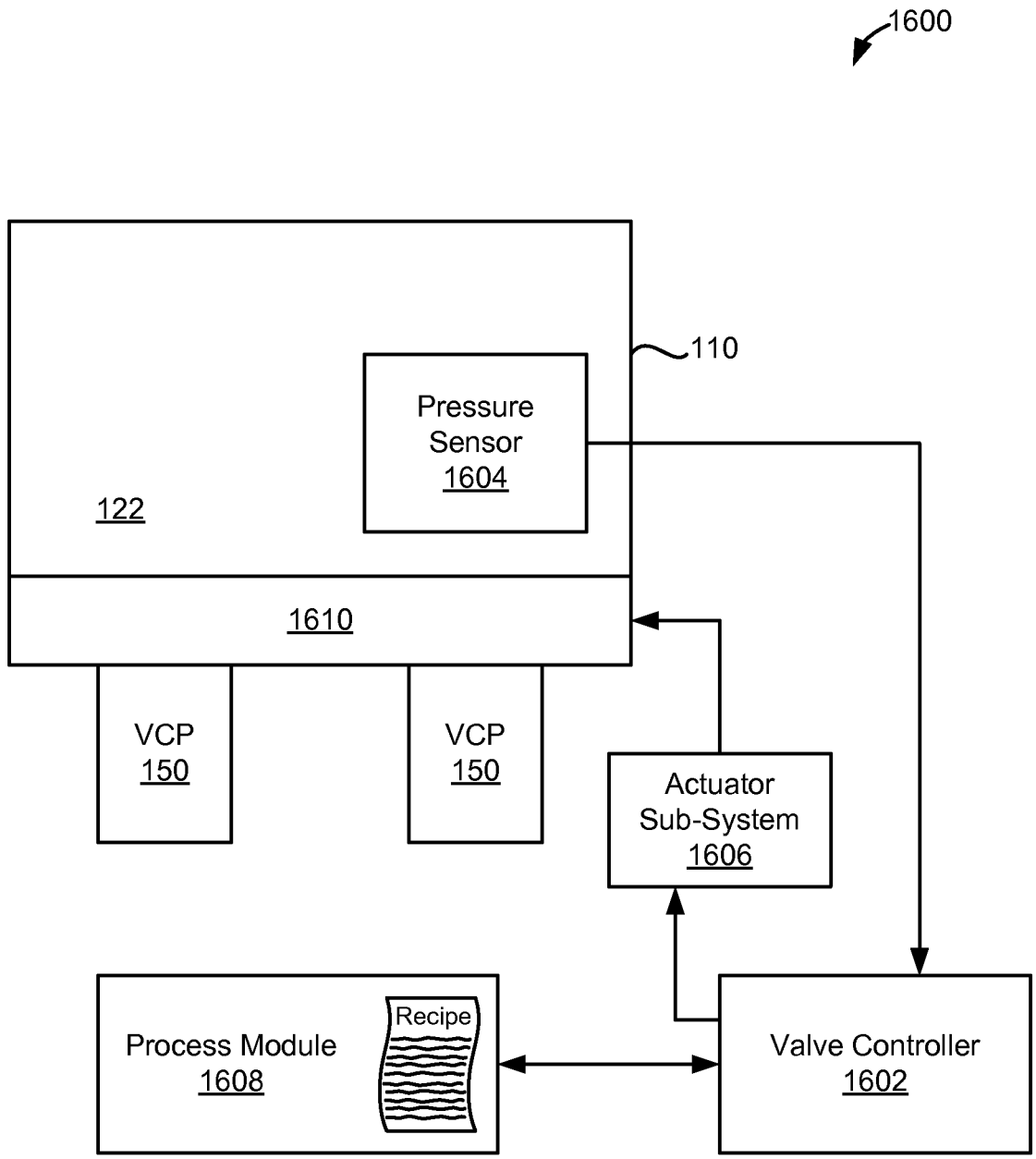
FIG. 16A is a block diagram of a plasma processing system to illustrate use of a valve controller and an actuator sub-system to control operation of the multi-port valve assembly of FIG. 2 or of FIG. 13A, according to one or more embodiments of present disclosure.
Figure 16B:
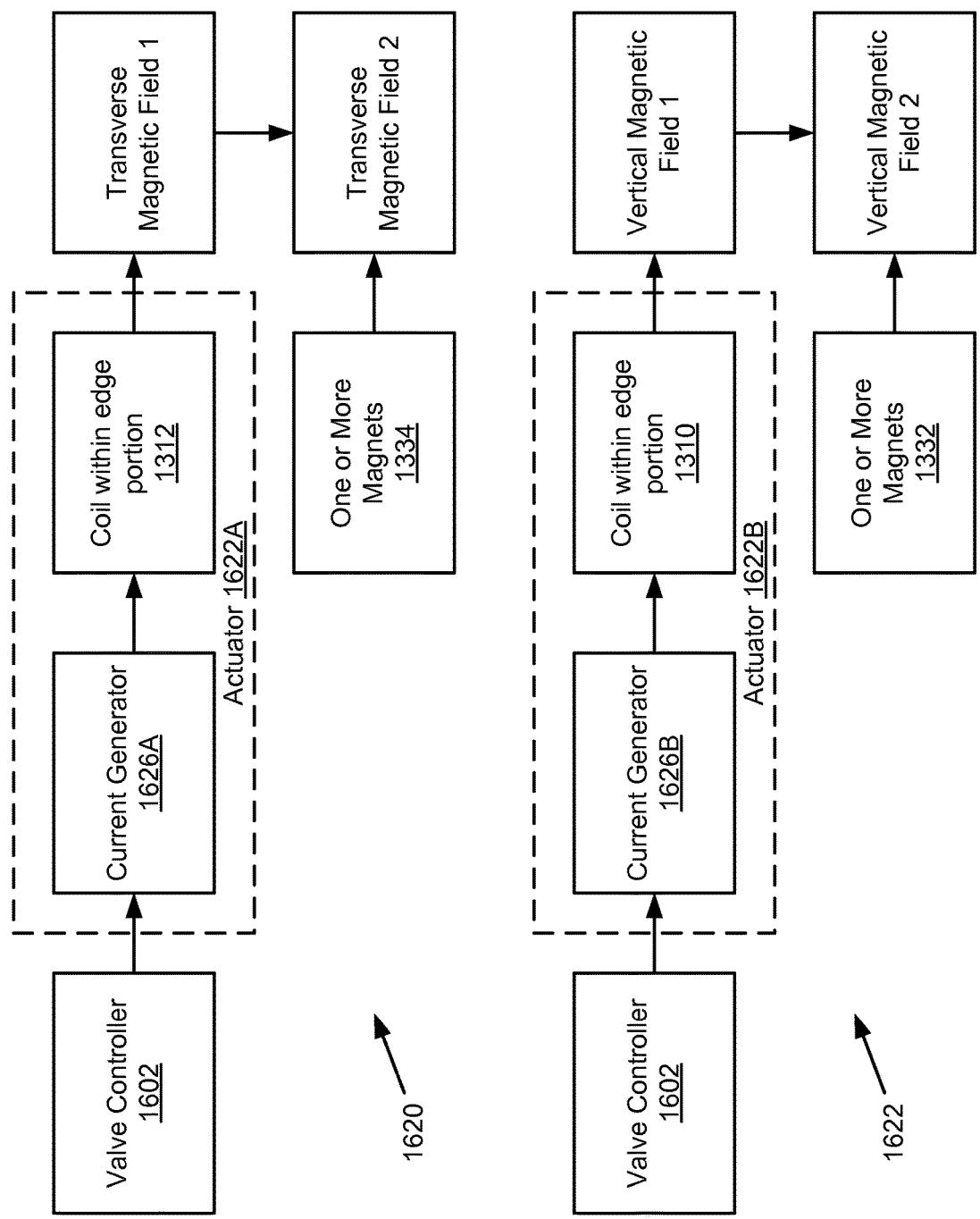
FIG. 16B includes block diagrams of multiple systems to illustrate functionality of a valve controller and actuators to control magnetic fields to further change positions of lobes of a rigid moveable seal plate or of portions of a top plate with respect to a bottom plate of the multi-port valve assembly of FIG. 2 or of FIG. 13A, according to one or more embodiments of present disclosure.

FIG. 16A is a block diagram of an embodiment of a plasma processing system 1600 to illustrate use of a valve controller 1602 and an actuator sub-system 1606 to control operation of a multi-port valve assembly 1610, e.g., the multi-port valve assembly 160 (FIG. 1), the multi-port valve assembly 1300 (FIG. 13A), etc. The system 1600 includes the plasma processing chamber 110, the vacuum pumps 150, the actuator sub-system 1606, the valve controller 1602, and a process module 1608. Examples of the actuator sub-system 1606 include the actuator 1622A (FIG. 16B) and actuator 1622B (FIG. 16B). The process module 1608 is an example of the host controller. In an embodiment, the process module 1608 is a portion of a computer software program that is executed by the processor of the host controller. The host controller executes the recipe by controlling various components of a plasma processing system. Examples of the various components include a motor and one or more connection links coupled to the motor to change gap between upper and lower electrodes of the plasma processing chamber 110 to control processing of the substrate 112, a valve that controls an amount of gas flow to the plasma processing chamber 110 to control processing of the substrate 112, a heater that is provided a current signal to heat an electrode within the plasma processing chamber 110 to control temperature of processing of the substrate 112, and the vacuum pumps 150 that are operated to achieve an amount of flow of materials from the interior region 122 to outside the interior region 112 to control pressure within the plasma processing chamber 110 during processing of the substrate 112, etc.

The valve controller 1602 receives the recipe from the process module 1608 and controls the actuator sub-system 1606 to further adjust positions of the lobes 144 (FIG. 3) of the rigid moveable seal plate 170 (FIG. 3) or of the portions 1302A, 1302B, and 1302C (FIG. 13A) of the top plate 1304. The pressure sensor 1604 monitors pressure within the interior region 122 of the plasma processing chamber 110 and provides the monitored pressure to the valve controller 1602. The valve controller 1602 compares the monitored pressure with the operating pressure specified within the recipe to determine whether the monitoring pressure is within a pre-determined threshold of the operating pressure. Upon determining that the monitored pressure is within the pre-determined threshold of the operating pressure, the valve controller 1602 does not send a signal to the actuator sub-system 1606 to change a position of the lobes 144 (FIG. 3) of the rigid moveable seal plate 170 (FIG. 3) or of the portions 1302A, 1302B, and 1302C (FIG. 13A) of the top plate 1304 with respect to the openings of the valve ports 142 (FIGS. 3 and 13A).

On the other hand, upon determining that the monitored pressure is outside the pre-determined threshold of the operating pressure, the valve controller 1602 sends a signal to the actuator sub-system 1606. Upon receiving the signal, the actuator sub-system 1606 moves the lobes 144 or the portions 1302A, 1302B, and 1302C to open, close, or partially open the openings of the valve ports 142 to achieve the pressure within the operating recipe.

FIG. 16B includes block diagrams of a system 1620 and a system 1622 to illustrate functionality of the valve controller 1602 and actuators to control magnetic fields to further change positions of the lobes 144 (FIG. 3) of the rigid moveable seal plate 170 (FIG. 3) or of the portions 1302A, 1302B, and 1302C (FIG. 13A) of the top plate 1304 with respect to the openings O1, O2, and O3 of the valve ports 142 (FIGS. 3 and 13A). The system 1620 includes the valve controller 1602 and an actuator 1622A, which includes a current generator 1626A and the coil within the edge portion 1312 (FIG. 13A). Examples of a current generator include one or more transistors. The system 1620 further includes the one or more magnets 1334.

The valve controller 1602 sends a command signal to the current generator 1626A for generating a current signal. The current signal is generated by the current generator 1626A upon receiving the command signal from the valve controller 1602. The current is provided from the current generator 1626A to the coil within the edge portion 1312. The coil within the edge portion 1312 generates a transverse magnetic field 1 in the transverse direction upon receiving the current signal from the current generator 1626A. Moreover, the one or more magnets 1334 are fixed, e.g., permanent, etc., magnets that generate one or more transverse magnetic fields 2. In one embodiment, the transverse magnetic fields 2 have a direction opposite to a direction of the transverse magnetic field 1. The transverse magnetic field 1 interferes with the one or more transverse magnetic fields 2 to open, close, or partially open the lobes 144 (FIG. 3) of the moveable seal plate 170 or the portions 1302A, 1302B, and 1302C (FIG. 13A) of the top plate 1304 with respect to the openings O1, O2, and O3 associated with the valve ports 142 (FIG. 3).

The system 1622 further includes the valve controller 1602 and an actuator 1622B, which includes a current generator 1626B and the coil within the edge portion 1310 (FIG. 13A). The system 1622 further includes the one or more magnets 1332.

The valve controller 1602 sends a command signal to the current generator 1626B for generating a current signal. The current signal is generated by the current generator 1626B upon receiving the command signal from the valve controller 1602. The current is provided from the current generator 1626B to the coil within the edge portion 1310. The coil within the edge portion 1310 generates a vertical magnetic field 1 in the vertical direction upon receiving the current signal from the current generator 1626B. Moreover, the one or more magnets 1332 are fixed magnets that generate one or more vertical magnetic fields 2. In one embodiment, the vertical magnetic fields 2 have a direction opposite to a direction of the vertical magnetic field 1. The vertical magnetic field 1 interferes with the one or more vertical magnetic fields 2 to seal or unseal the lobes 144 (FIG. 3) of the moveable seal plate 170 or the portions 1302A, 1302B, and 1302C (FIG. 13A) of the top plate 1304 with respect to the openings of the valve ports 142 (FIG. 3).

In one embodiment, the valve controller 1602 controls the actuator 1622A and the actuator 1622B to achieve periodic interspersed rotational and vertical movement of the lobes 144 or the portions 1302A, 1302B, and 1302C. For example, the valve controller 1602 sends a signal to the actuator 1622A to modify the transverse field 1 for a first period of time to rotate the lobes 144 or the portions 1302A, 1302B, and 1302C for the first period of time. Then, the valve controller 1602 sends a signal to the actuator 1622B to modify the vertical field 1 for a second period of time to vertically move the lobes 144 or the portions 1302A, 1302B, and 1302C for the second period of time. Thereafter, the valve controller 1602 sends a signal to the actuator 1622A to modify the transverse field 1 for a third period of time to rotate the lobes 144 or the portions 1302A, 1302B, and 1302C for the third period of time. The first period of time is equal to the second period of time, which is equal to the third period of time. In an embodiment, the first period of time is unequal to, e.g., greater than, less than, etc., at least one of the second period of time and the third period of time.

Figure 17A:
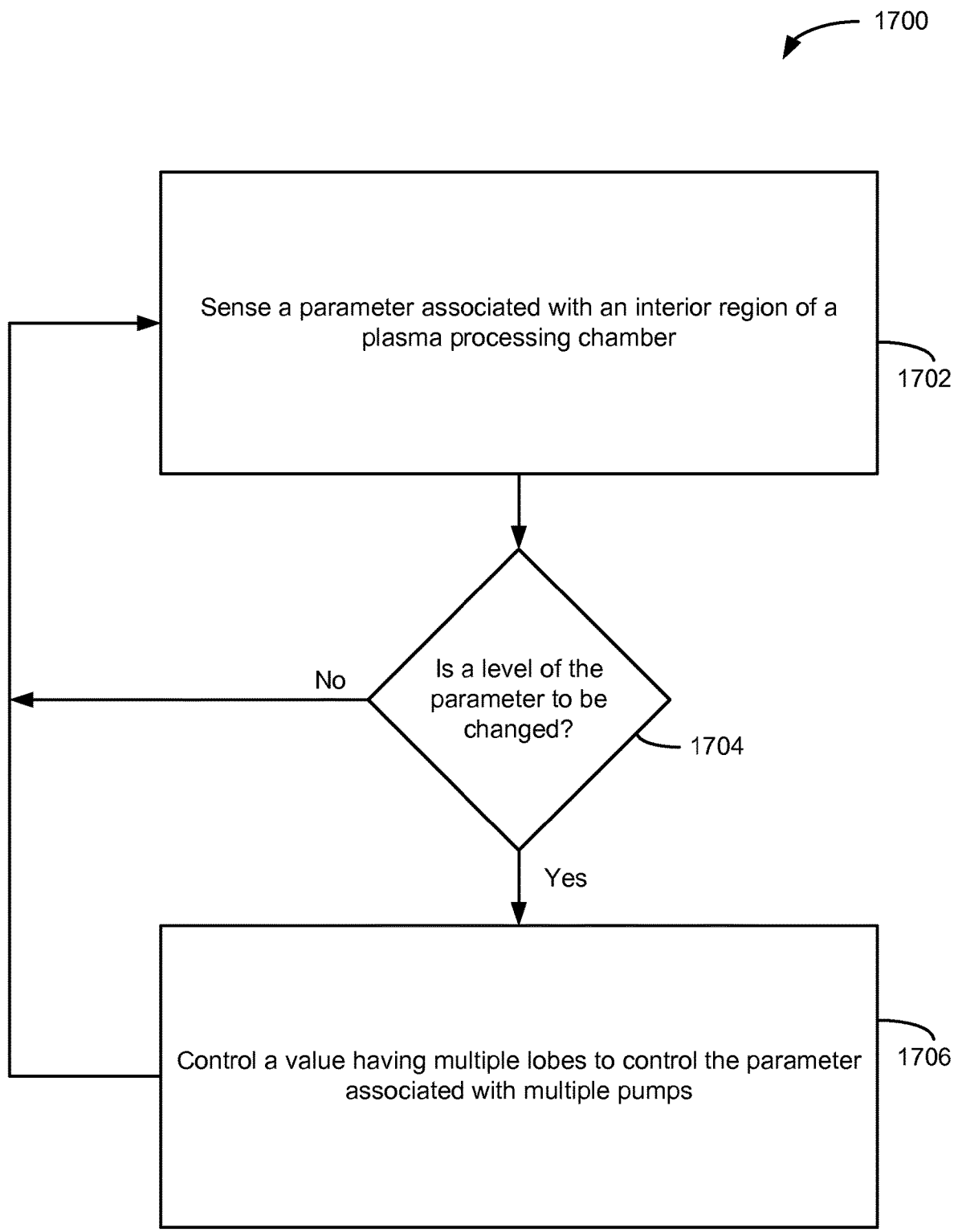
FIG. 17A is a flowchart of a method for controlling positions of the lobes (FIG. 3) of the rigid moveable seal plate or of the portions of the top plate, according to one or more embodiments of present disclosure.

FIG. 17A is a flowchart of an embodiment of a method 1700 for controlling the positions of the lobes 144 (FIG. 3) of the rigid moveable seal plate 170 (FIG. 3) or of the portions 1302A, 1302B, and 1302C (FIG. 13A) of the top plate 1304. The method 1700 includes an operation 1702 of sensing a parameter, e.g., the condition, etc., associated with the interior region 122 (FIG. 1) of the plasma processing chamber 110. For example, the pressure within the interior region 122 is measured by the pressure sensor or the flow rates associated with the openings O1, O2, and O3 associated with the valve ports 142 (FIG. 3) are measured by one or more flow meters, which may be placed within the interior region 122 or outside the plasma processing chamber 110.

The sensed parameter is provided from a sensor, e.g., the pressure sensor 1604 (FIG. 16A), one or more flow meters, etc., to the valve controller 1602 (FIG. 16A). The valve controller 1602 determines, in an operation 1704, from the sensed parameter whether a level, e.g., an amount, etc., of the sensed parameter is to be changed. For example, the valve controller 1602 compares the sensed parameter to a parameter within the recipe and determines based on the comparison that the sensed parameter is not within a pre-determined threshold from the parameter. Upon determining that the sensed parameter is not within the pre-determined threshold from the parameter, the valve controller 1602 determines that the sensed parameter is to be changed. On the other hand, upon determining that the sensed parameter is within the pre-determined threshold from the parameter, the valve controller 1602 determines that the sensed parameter is not to be changed.

Upon determining that the level of the sensed parameter is to be changed, the valve controller 1602 identifies a position of the lobes 144 (FIG. 3) of the moveable seal plate 170 or the portions 1302A, 1302B, and 1302C (FIG. 13A) of the top plate 1304 with respect to the openings O1, O2, and O3 associated with the valve ports 142 (FIG. 3). For example, the look-up table stored within the memory device of the valve controller 1602 is read to determine a position of the lobes 144 or of the portions 1302A, 1302B, and 1302C with respect to the openings O1, O2, and O3 of the bottom plate 147 (FIG. 3). Moreover, the look-up table is read to determine amounts of currents to be generated by the current generators 1626A and 1626B (FIG. 16B) to achieve the position of the lobes 144 or of the portions 1302A, 1302B, and 1302C.

In an operation 1706 of the method 1700, the valve controller 1602 controls the lobes 144 of the moveable seal plate 170 or the portions 1302A, 1302B, and 1302C of the top plate 1304 to achieve the parameter to reduce or eliminate the difference between the sensed parameter and the parameter of the recipe so that the parameter of the recipe and the sensed parameter are within the pre-determined threshold. For example, the valve controller 1602 sends a command signal to the actuator sub-system 1606 (FIG. 16A). The command signal includes levels, e.g., amounts, etc., of currents to be generated by the coils within the edge portions 1310 and 1312 (FIG. 13A). Upon receiving the command signal, the actuator sub-system 1606 generates the levels of current signals to, e.g., seal, unseal, open, partially open, or close, etc., the lobes 144 or the portions 1302A, 1302B, and 1302C with respect to the openings O1, O2, and O3. The levels of current signals generated facilitate achieving the positions, e.g., the angles θ1, θ2, θ3, a z-position zd, etc. of the lobes 144 of the moveable seal plate 170 or the portions 1302A, 1302B, and 1302C of the top plate 1304 with respect to the openings O1, O2, and O3 so that the parameter of the recipe and the sensed parameter are within the pre-determined threshold. The z-position zd is of each of the lobes 144 with respect to the bottom plate 147 or of each of the portions 1302A, 1302B, and 1302C with respect to the bottom plate 147. The method 1700 repeats after the operation 1706.

It should be noted that sometimes, the moveable seal plate 170 or the top plate 1304 is referred to herein as a valve.

In an embodiment, the method 1700 of FIG. 17A is applicable to the multi-port valve assembly 1406 of FIG. 14. For example, after sensing, in the operation 1702, a parameter, e.g., pressure, etc., associated within an interior region of the plasma processing chamber illustrated in FIG. 14 and determining whether a level of the parameter is to be changed, the valve controller instructs the actuator, e.g., a driver that is connected to a motor, etc., to rotate the flaps 1404A and 1404B (FIG. 14) about the hinge 1412 (FIG. 14) to control the parameter. For example, the valve controller identifies an amount of current corresponding to, e.g., having a mapping relationship with, have a one-on-one correspondence to, etc., the parameter, and provides the amount of current to the driver for generation of the amount of current by the driver. The amount of current also corresponds to an amount of rotation of the flaps 1404A and 1404B with respect to the corresponding openings.

Figure 17B:
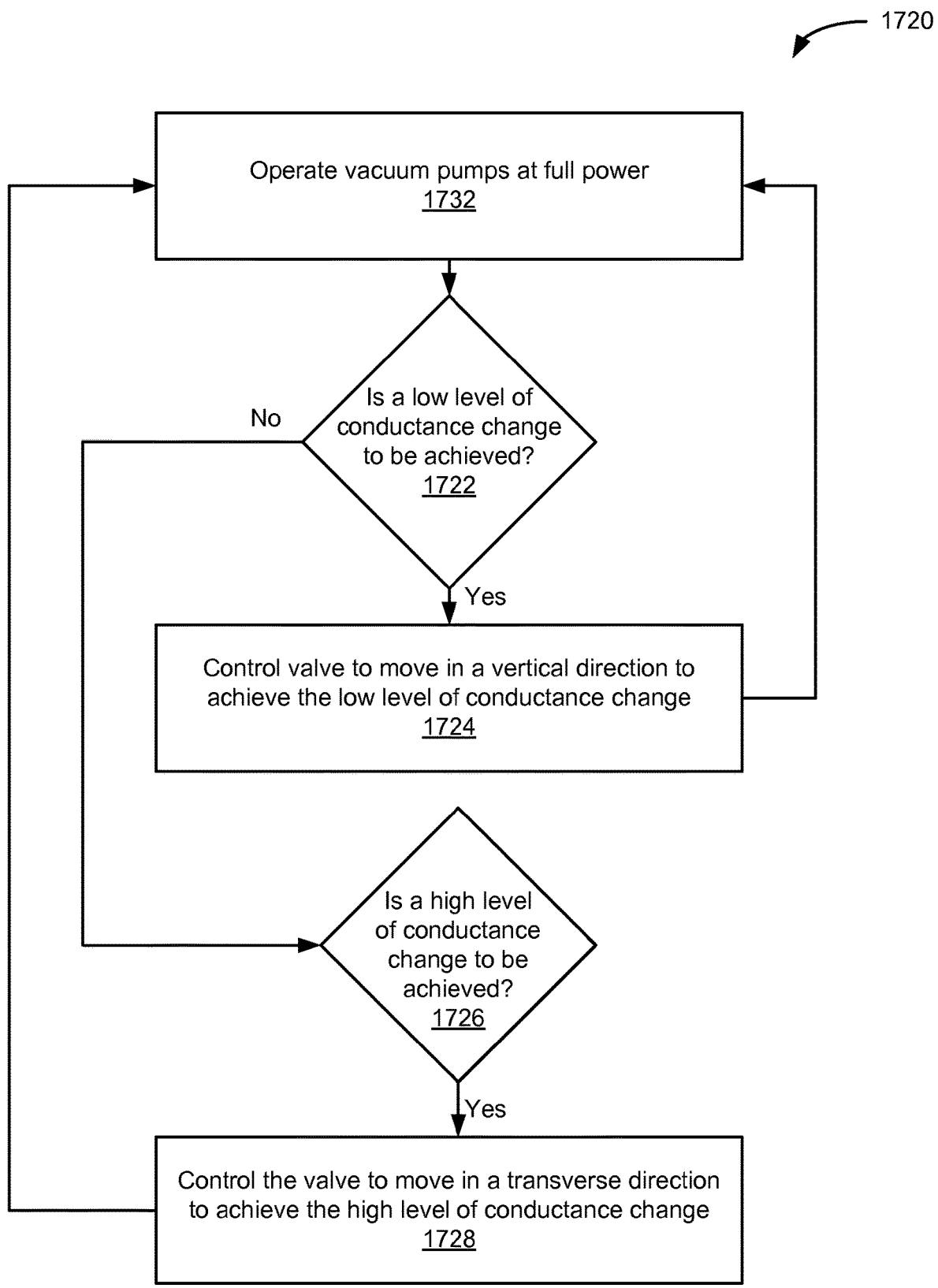
FIG. 17B is a flowchart of a method for illustrating that the moveable seal plate is moved in a transverse direction to achieve a high level of change in flow conductance and is moved in a vertical direction to achieve a low level of change in flow conductance, according to one or more embodiments of present disclosure.

FIG. 17B is a flowchart of an embodiment of a method 1720 for illustrating that the moveable seal plate 170 is moved in the transverse direction to achieve a high level of change in flow conductance and is moved in the vertical direction to achieve a low level of change in flow conductance. During the method 1720, the vacuum pumps 150 (FIG. 1) are operated at full power, e.g., maximum power at which the vacuum pumps can operate, maximum specified operating power of the vacuum pumps, peak power, etc. The vacuum pumps 150 are operated at full power in an operation 1732 of the method 1720.

Moreover, in an operation 1722 of the method 1720, the valve controller 1602 (FIG. 16A) determines whether a low level of change in flow conductance from the interior region 122 (FIG. 1) to the vacuum pumps 150 is to be achieved. For example, the low level of change is to be achieved based on the recipe, e.g., to achieve a pressure specified in the recipe, to achieve a flow conductance specified in the recipe, etc., and an amount of time for accomplishing the low level of change. As another example, if a pressure to be achieved within the interior region 122 is within a pre-determined range from a sensed pressure or a pressure at which the plasma processing chamber 110 (FIG. 1) is currently operating and the pressure to be achieved can be achieved within a time period less than a pre-determined time period, the low level of change in flow conductance is to be applied to achieve the pressure.

Upon determining that the low level of flow conductance change is to be achieved, the valve controller 1602 controls, in an operation 1724, the lobes 144 of the moveable seal plate 170 or the portions 1302A, 1302B, and 1302C of the top plate 1304 to move in the vertical direction. For example, the valve controller 1602 identifies from the memory device of the valve controller 1602 an amount of current to send to the coil within the edge portion 1310 (FIG. 16B). The amount of current is sent from the valve controller 1602 to the current generator 1626B (FIG. 16B). The current generator 1626B generates a current signal having the amount of current and sends the current signal to the coil within the edge portion 1310. The coil within the edge portion 1310 modifies a magnetic field in the z-direction that interferes with the one or more vertical magnetic fields generated by the one or more magnets 1332 (FIG. 16B) to change, e.g., move upward, move downward, etc., the zd position of the lobes 144 of the moveable seal plate 170 or the portions 1302A, 1302B, and 1302C of the top plate 1304 with respect to the bottom plate 147 (FIGS. 2 and 13A).

On the other hand, upon determining that the low level of conductance change is not to be achieved, in an operation 1726 of the method 1720, the valve controller 1602 determines whether a high level of change in flow conductance from the interior region 122 (FIG. 1) to the vacuum pumps 150 is to be achieved. For example, the high level of change is to be achieved based on the recipe, e.g., to achieve a pressure specified in the recipe, to achieve a flow conductance specified in the recipe, etc., and an amount of time for accomplishing the high level of change. As another example, if a pressure to be achieved within the interior region 122 is outside a pre-determined range from a sensed pressure or a pressure at which the plasma processing chamber 110 (FIG. 1) is currently operating and the pressure to be achieved cannot be achieved within a time period less than a pre-determined time period, the high level of change in flow conductance is to be applied to achieve the pressure.

Upon determining that the high level of flow conductance change is to be achieved, the valve controller 1602 controls, in an operation 1728, the lobes 144 of the moveable seal plate 170 or the portions 1302A, 1302B, and 1302C of the top plate 1304 to move in the transverse direction. For example, the valve controller 1602 identifies from the memory device of the valve controller 1602 an amount of current to send to the coil within the edge portion 1312 (FIG. 16B). The amount of current is sent from the valve controller 1602 to the current generator 1626A (FIG. 16B). The current generator 1626A generates a current signal having the amount of current and sends the current signal to the coil within the edge portion 1312. The coil within the edge portion 1312 modifies a magnetic field in the transverse direction that interferes with the one or more magnetic fields generated in the transverse direction by the one or more magnets 1334 (FIG. 16B) to change, e.g., rotate, etc., a position, e.g., the angles θ1, θ2, and θ3, etc., of the lobes 144 of the moveable seal plate 170 simultaneously or the portions 1302A, 1302B, and 1302C of the top plate 1304 simultaneously with respect to the bottom plate 147 (FIGS. 2 and 13A). It should be noted that the vacuum pumps 150 are operated at full power during all the operations 1732, 1722, 1724, 1726, and 1728 of the method 1720.

Figure 18A:
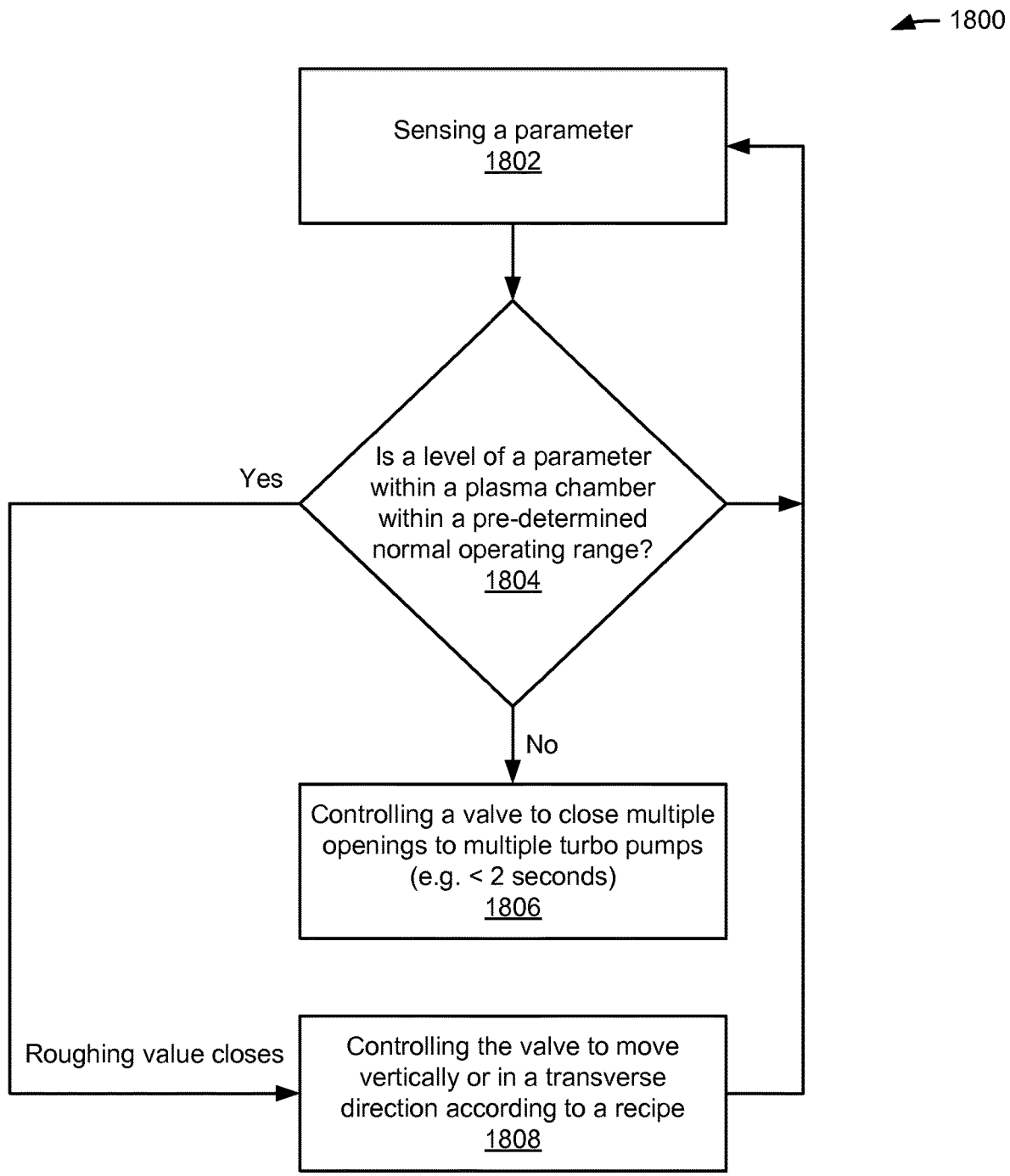
FIG. 18A is a flowchart of a method for controlling the multi-port valve assembly of FIG. 2 or of FIG. 13A according to a change in a sensed parameter, according to one or more embodiments of present disclosure.
Figure 18B:
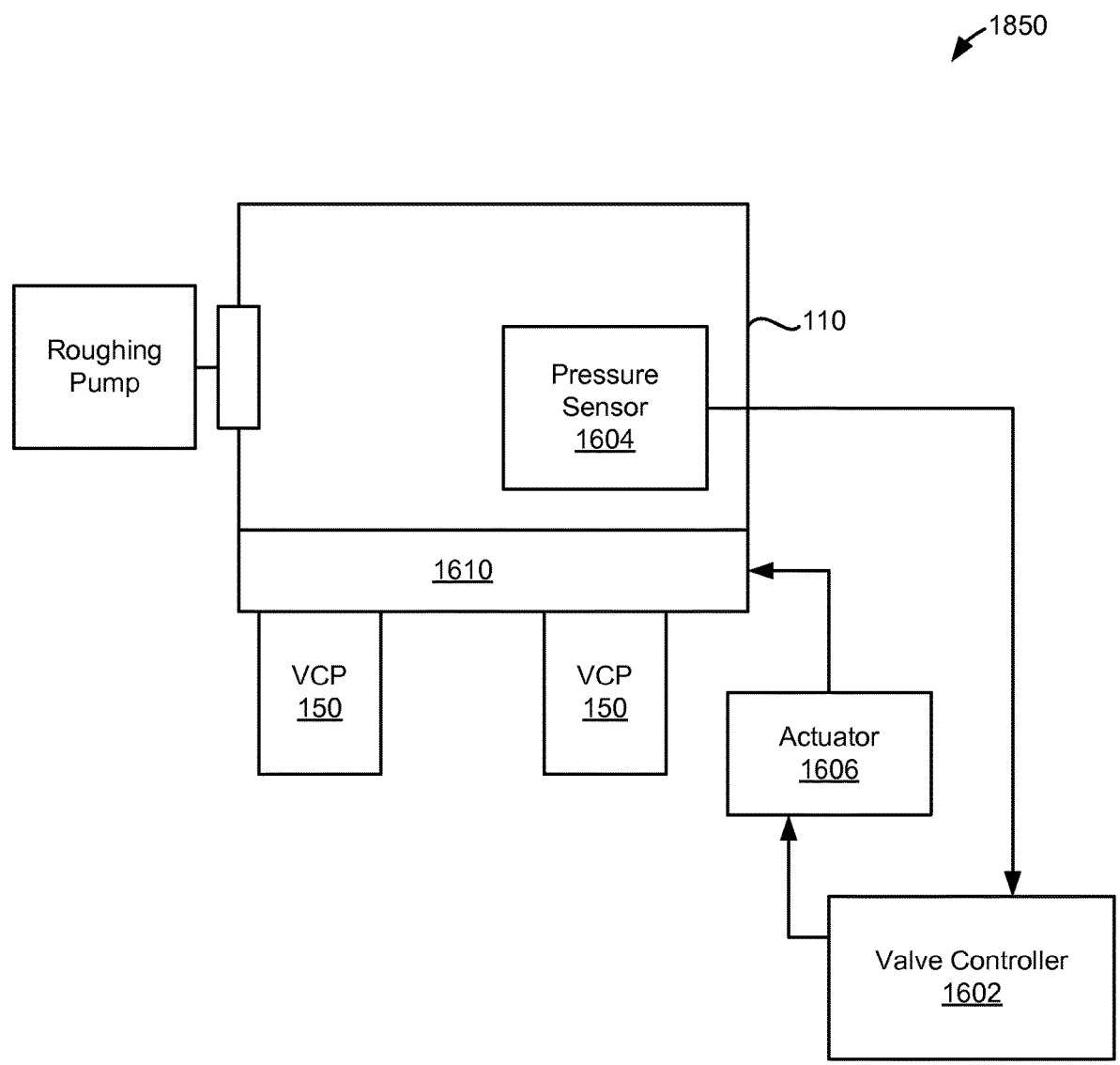
FIG. 18B is a block diagram of a plasma processing system to illustrate the method of FIG. 18A, according to one or more embodiments of present disclosure.

FIG. 18A is a flowchart of an embodiment of a method 1800 for controlling the multi-port valve assembly 160 (FIG. 2) or 1300 (FIG. 13A) according to a change in the sensed parameter. The method 1800 is described with reference to a plasma processing system 1850 of FIG. 18B. The method 1800 is performed upon achieving a pressure within the plasma processing chamber 110, which is illustrated in FIG. 18B. The pressure is achieved by operating a roughing pump, which is also illustrated in FIG. 18B. For example, the roughing pump is operated to reduce pressure within the plasma processing chamber 110 until a pre-determined amount of reduced pressure is achieved. The vacuum pumps 150, illustrated in FIG. 18B, are operated after the reduced pressure is reached within the plasma processing chamber 110.

The method 1800 includes an operation 1802 of sensing the parameter, e.g., pressure, etc., within the plasma processing chamber 110 (FIG. 1). The sensing is done by a pressure sensor.

The sensed parameter is sent from the pressure sensor to the valve controller 1602, illustrated below in FIG. 18B. The valve controller 1602 determines, in an operation 1804, whether a level of the sensed parameter is within a pre-determined normal operating range. For example, the valve controller 1602 compares the level of the sensed parameter with a pre-stored parameter listed within the recipe to determine whether the level of the sensed parameter is within a pre-determined threshold from the pre-stored parameter. Upon determining that the level of the sensed parameter is within the pre-determined threshold of from the pre-stored parameter, the valve controller 1602 determines that the level of the sensed parameter is within the pre-determined normal operating range. For example, upon determining that the level of the sensed parameter is below the pre-determined threshold of the pre-stored parameter, the valve controller 1602 determines that the level of the sensed parameter is within the pre-determined normal operating range. On the other hand, upon determining that the level of the sensed parameter is not within the pre-determined threshold of the pre-stored parameter, the valve controller 1602 determines that the level of the sensed parameter is not within the pre-determined normal operating range. For example, upon determining that the level of the sensed parameter is above the pre-determined threshold of the pre-stored parameter, the valve controller 1602 determines that the level of the sensed parameter is not within the pre-determined normal operating range.

Moreover, upon determining that the level of the sensed parameter is within the pre-determined normal operating range, the valve controller 1602, in an operation 1808, controls the moveable seal plate 170 (FIG. 2) or the top plate 1304 (FIG. 13A) to move vertically or in the transverse direction. For example, the valve controller 1602 controls the actuator 1606, illustrated in FIG. 18B, in accordance with the recipe so that the moveable seal plate 170 or the top plate 1304 moves with respect to the openings O1 thru O3 (FIGS. 2 and 13A) to change the angles θ1, θ2, and θ3 or to change the distance zd in the vertical direction or a combination thereof.

On the other hand, upon determining that the level of the sensed parameter is not within the pre-determined normal operating range, in an operation 1806, the valve controller 1602 controls the actuator 1606 to move the moveable seal plate 170 (FIG. 2) so that the lobes 144 (FIG. 3) seal or close the openings O1, O2, and O3 of the bottom plate 147 (FIG. 2) within a pre-determined amount of time, e.g., less than two seconds, etc. In an embodiment, in the operation 1806, the valve controller 1602 controls the actuator 1606 to move the top plate 1304 so that the portions 1302A, 1302B, and 1302C are in a sealed position or in a closed position in which the openings O1, O2, and O3 are covered. The operation 1806 facilitates prevention of damage to the vacuum pumps 150. The change in the sensed parameter beyond the pre-determined normal operating range may be a result of a broken wafer within the plasma processing chamber 110 or a damaged part, e.g., electrode, confinement rings, electrode extension, edge ring, etc., within the plasma processing chamber 110. If the openings O1, O2, and O3 were to stay open for a longer period of time, there could be damage to the vacuum pumps 150, e.g., blades of the vacuum pumps 150, etc. The damage is prevented by closing the openings O1, O2, and O3 immediately upon determining that the sensed parameter is outside the pre-determined normal operating range.

Moreover, the use of the single valve controller 1602 facilitates quick closure of the openings O1, O2, and O3. It takes more time for two valves to be closed compared to closure of the openings O1 thru O3 by the lobes 144 or the portions 1302A, 1302B, and 1302C. Moreover, if there is a lack of communication or malfunction during communication between multiple controllers that control multiple valves, the valves may not close or may not close on time. In case of the valve controller 1602, there is no master controller and no slave controller, and so chances of the lack of communication or the malfunction diminish to zero.

In an embodiment, the method 1800 of FIG. 18A is applicable to the multi-port valve assembly 1406 of FIG. 14. For example, after sensing, in the operation 1802, a parameter associated within an interior region of the plasma processing chamber illustrated in FIG. 14 and determining whether a level of the parameter is not within the pre-determined normal operating range, the valve controller instructs the actuator, e.g., a driver that is connected to a motor, etc., to rotate the flaps 1404A and 1404B (FIG. 14) about the hinge 1412 (FIG. 14) to seal the openings in the metal plate 1406 (FIG. 14). On the other hand, upon determining that the level of the parameter is within the pre-determined normal operating range, the valve controller instructs the actuator to rotate the flaps 1404A and 1404B about the hinge 1412 in accordance with the recipe.

FIG. 18B is a block diagram of an embodiment of the plasma processing system 1850 to illustrate the method 1800 of FIG. 18A. The plasma processing system 1850 includes the roughing pump in addition to other components illustrated in FIG. 16A.

FIG. 19 shows graphs 1902, 1904, and 1906 to illustrate a change in flow conductance from the interior region 122 (FIG. 1) to the vacuum pumps 150 (FIG. 1) with movement of the moveable seal plate 170 (FIG. 2) or the top plate 1304 (FIG. 13A). The graph 1902 illustrates that a change in flow conductance is linear when the moveable seal plate 170 or the top plate 1304 is moved the distance zd from a sealed position to an unsealed position in the vertical direction with respect to the bottom plate 147 (FIG. 2). The graph 1904 illustrates that a change in flow conductance is nonlinear when the moveable seal plate 170 or the top plate 1304 is moved to rotate to change the angles θ1, θ2, and θ3 from a closed position to one or more progressively increasing partially open positions and further to an open position with respect to the bottom plate 147. The graph 1306 illustrates that a change in flow conductance is a combination of linear and nonlinear when the moveable seal plate 170 or the top plate 1304 is moved vertically and rotated simultaneously, with the rotation and the movement in the vertical direction interspersed and repeating periodically. For example, the graph 1306 represents a change in flow conductance when the moveable seal plate 170 is moved vertically for a period of time from the sealed and closed position, then is rotated for the period of time, then is moved vertically for the period of time, and so on until the moveable seal plate 170 is in the open position and in the unsealed position.

While various embodiments of mechanical systems operable to actuate and/or constrain the motion of the movable seal plate 170 or the top plate 1304 in the transverse direction, sealing direction, or both, it should be understood that these are illustrative and other mechanical embodiments may be used to transition the movable seal plate 170 or the top plate 1304 between the closed, partially open, and open states.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, a capacitively coupled plasma chamber, a transformer coupled plasma chamber, and any other semiconductor processing systems that is associated or used in the fabrication and/or manufacturing of semiconductor wafers.

It is further noted that the above-described operations are used with a parallel plate plasma chamber, e.g., a capacitively coupled plasma chamber, etc., in some embodiments. In some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Various modifications and variations can be made to the embodiments described herein without departing from the scope of the claimed subject matter. Thus it is intended that the specification cover the modifications and variations of the various embodiments described herein provided such modification and variations come within the scope of the appended claims and their equivalents.

The invention claimed is:

1. A plasma chamber for controlling conductance of materials, comprising:
    a top wall;
    a bottom wall located below the top wall and having a bottom plate;
    a center column;
    a wafer stage; and
    a multi-valve port assembly including:
        a plurality of actuator components coupled to a plurality of flow rate sensors to operate based on a plurality of flow rates measured by the plurality of flow rate sensors, wherein the plurality of actuator components include a first coil, wherein the bottom plate has the first coil, wherein the first coil transfers a first current to create a first magnetic field;
        a top plate surrounding a feed through port formed within the bottom wall of the plasma chamber, wherein the top plate has a plurality of openings and a plurality of plate portions, wherein the feed through port allows passage of the center column that supports the wafer stage of the plasma chamber, wherein the center column is narrower than the wafer stage and located below the wafer stage, wherein the plurality of plate portions and the plurality of openings in the top plate are interleaved with respect to each other, wherein the plurality of plate portions and the plurality of openings in the top plate surround the feed through port, wherein the top plate has a first magnet that creates a second magnetic field that interferes with the first magnetic field to move the top plate with respect to the bottom plate in a vertical direction; and
        the bottom plate located below and adjacent to the top plate and having a plurality of openings that surround the feed through port,
        wherein the top plate rotates in a transverse direction with respect to the bottom plate and achieves the movement in the vertical direction with respect to the bottom plate based on the plurality of flow rates measured by the plurality of flow rate sensors, wherein each of the plurality of openings in the bottom plate and the plurality of openings in the top plate and the plurality of plate portions of the top plate is equal in number to the plurality of flow rate sensors, wherein the plurality of flow rates are of materials flowing from the plasma chamber via the plurality of openings in the top plate and the plurality of the openings in the bottom plate to a plurality of vacuum pumps outside the plasma chamber, wherein the rotation of the top plate in the transverse direction changes an amount of overlap between one of the plurality of plate portions of the top plate and one of the plurality of openings in the bottom plate and an amount of overlap between another one of the plurality of plate portions of the top plate and another one of the plurality of openings in the bottom plate, wherein the changes in the amounts of overlap and the movement in the vertical direction modifies an amount of the conductance of the materials flowing from the plasma chamber via the plurality of openings in the top plate and the plurality of openings in the bottom plate to the plurality of vacuum pumps,
wherein the plurality of openings in the bottom plate lie adjacent to and above the plurality of vacuum pumps.

2. The plasma chamber of claim 1, wherein the plurality of plate portions are moved in a stepwise fashion in the vertical direction so that the top plate moves in the vertical direction to achieve a plurality of degrees of an unsealed state with respect to the bottom plate, wherein each of the plurality of degrees of the unsealed state corresponds to a different vertical distance between the top plate and the bottom plate.

3. The plasma chamber of claim 1, wherein the plurality of plate portions include a first plate portion and a second plate portion, wherein the plurality of openings in the top plate include a first opening and a second opening, wherein the first opening is located besides the first plate portion, the second plate portion is located besides the first opening, and the second opening is located besides the second plate portion.

4. The plasma chamber of claim 1, wherein the bottom plate has a top edge portion, wherein the top edge portion includes a second coil, wherein the plurality of actuator components include the second coil, wherein the second coil of the top edge portion is configured to receive a second current to generate a third magnetic field, wherein the top plate includes a second magnet configured to generate a fourth magnetic field, wherein the third and fourth magnetic fields interfere with each other to rotate the top plate in the transverse direction with respect to the bottom plate.

5. The plasma chamber of claim 4, wherein the bottom plate has a bottom edge portion, wherein the bottom edge portion includes the first coil, wherein the first coil of the bottom edge portion is configured to receive the first current to generate the first magnetic field.

6. The plasma chamber of claim 5, wherein the top plate includes a metallic shield located above the first magnet and besides the second magnet to shield a substrate within the plasma chamber from the second and fourth magnetic fields.

7. The plasma chamber of claim 1, wherein the center column includes a plasma electrode assembly and a plasma producing gas inlet.

8. The plasma chamber of claim 1, wherein the bottom plate is a part of the bottom wall of the plasma chamber, wherein each of the plurality of openings in the bottom plate interfaces with a corresponding one of the plurality of vacuum pumps.

9. The plasma chamber of claim 1, wherein each of the plurality of openings in the top plate is bordered on its periphery by a material of the top plate.

10. The plasma chamber of claim 1, wherein the plurality of openings in the top plate are equal in number to the plurality of openings in the bottom plate and to the plurality of vacuum pumps.

11. The plasma chamber of claim 1, wherein the plurality of openings in the top plate include a first opening, a second opening, and a third opening, wherein the plurality of openings in the bottom plate include a fourth opening, a fifth opening, and a sixth opening, wherein the plurality of vacuum pumps include a first vacuum pump, a second vacuum pump, and a third vacuum pump, wherein the fourth opening interfaces with the first vacuum pump, the fifth opening interfaces with the second vacuum pump, and the sixth opening interfaces with the third vacuum pump.

12. The plasma chamber of claim 1, wherein the number of plurality of plate portions is equal to three.

13. The plasma chamber of claim 1, the plurality of actuator components are coupled to the top plate to rotate the top plate in the transverse direction with respect to the bottom plate and to move the top plate in the vertical direction with respect to the bottom plate based on a sum of the plurality of flow rates measured by the plurality of flow rate sensors.

14. The plasma chamber of claim 1, wherein the first coil is located along a circumference of the bottom plate, wherein the bottom plate has a second coil located along the circumference of the bottom plate, wherein the second coil is located above the first coil, wherein the second coil transfers a second current to create a third magnetic field.

15. The plasma chamber of claim 14, wherein the top plate has a second magnet that generates a fourth magnetic field that interferes with the third magnetic field to rotate the top plate in the transverse direction with respect to the bottom plate.

16. The plasma chamber of claim 1, wherein the top plate moves in a stepwise manner in the vertical direction from a first unsealed position with respect to the bottom plate to a second unsealed portion with respect to the bottom plate.

17. The plasma chamber of claim 1, wherein the bottom plate has an edge portion, the plasma chamber comprising:
a removable seal plate located above the top plate and coupled to the edge portion of the bottom plate;
a removable liner surrounding the feed through port;
wherein the removable seal plate extends towards the removable liner and the removable liner extends towards the removable seal plate.

18. The plasma chamber of claim 1, wherein the top plate has a metallic shield situated above the first magnet to reduce chances of the second magnetic field from interfering with plasma formed between the top and bottom walls.

19. A plasma chamber comprising:
a top wall;
a plurality of side walls coupled to the top wall;
a bottom wall having a bottom plate, wherein the bottom wall is coupled to the plurality of side walls, wherein the bottom wall has a feed through port;
a wafer stage that is located between the plurality of side walls, above the bottom wall, and below the top wall;
a portion of a center column passing through the feed through port to be coupled to the wafer stage, wherein the feed through port allows passage of the center column that supports the wafer stage, wherein the center column is narrower than the wafer stage and located below the wafer stage; and
a multi-valve port assembly that is coupled to the bottom wall to form a part of the bottom wall, the multi-valve port assembly including:
a plurality of actuator components coupled to a plurality of flow rate sensors to operate based on a plurality of flow rates measured by the plurality of flow rate sensors, wherein the plurality of actuator components include a first coil, wherein the bottom plate has the first coil, wherein the first coil transfers a first current to create a first magnetic field;

a top plate surrounding the feed through port formed within the bottom wall of the plasma chamber, wherein the top plate has a plurality of openings and a plurality of plate portions, wherein the plurality of openings in the top plate and the plurality of plate portions surround the portion of the center column, wherein the plurality of plate portions and the plurality of openings in the top plate are interleaved with respect to each other, wherein the plurality of plate portions and the plurality of openings in the top plate surround the feed through port, wherein the top plate has a first magnet that creates a second magnetic field that interferes with the first magnetic field to move the top plate with respect to the bottom plate in a vertical direction; and the bottom plate located below and adjacent to the top plate and having a plurality of openings that surround the feed through port, wherein the top plate rotates in a transverse direction with respect to the bottom plate and achieves the movement in the vertical direction with respect to the bottom plate based on the plurality of flow rates measured by the plurality of flow rate sensors, wherein each of the plurality of openings in the bottom plate and the plurality of openings in the top plate and the plurality of plate portions of the top plate is equal in number to the plurality of flow rate sensors, wherein the plurality of flow rates are of materials flowing from the plasma chamber via the plurality of openings in the top plate and the plurality of the openings in the bottom plate to a plurality of vacuum pumps outside the plasma chamber, wherein the rotation of the top plate in the transverse direction changes an amount of overlap between one of the plurality of plate portions of the top plate and one of the plurality of openings in the bottom plate and an amount of overlap between another one of the plurality of plate portions of the top plate and another one of the plurality of openings in the bottom plate, wherein the changes in the amounts of overlap and the movement in the vertical direction modifies an amount of the conductance from the plasma chamber via the plurality of openings in the top plate and the plurality of openings in the bottom plate to the plurality of vacuum pumps, wherein the plurality of openings in the bottom plate lie adjacent to and above the plurality of vacuum pumps.

20. The plasma chamber of claim 19, wherein the plurality of plate portions are moved in a stepwise fashion in the vertical direction so that the top plate moves in the vertical direction to achieve a plurality of degrees of an unsealed state with respect to the bottom plate, wherein each of the plurality of degrees of the unsealed state corresponds to a different vertical distance between the top plate and the bottom plate.

21. The plasma chamber of claim 19, wherein the plurality of plate portions include a first plate portion and a second plate portion, wherein the plurality of openings in the top plate include a first opening and a second opening, wherein the first opening is located besides the first plate portion, the second plate portion is located besides the first opening, and the second opening is located besides the second plate portion.

22. The plasma chamber of claim 19, wherein the bottom plate has a top edge portion, wherein the top edge portion includes a second coil, wherein the plurality of actuator components include the second coil, wherein the second coil of the top edge portion is configured to receive a second current to generate a third magnetic field, wherein the top plate includes a second magnet configured to generate a fourth magnetic field, wherein the third and fourth magnetic fields interfere with each other to rotate the top plate in the transverse direction with respect to the bottom plate.

23. The plasma chamber of claim 22, wherein the bottom plate has a bottom edge portion, wherein the bottom edge portion includes the first coil, wherein the first coil of the bottom edge portion is configured to receive the first current to generate the first magnetic field.

24. The plasma chamber of claim 23, wherein the top plate includes a metallic shield located above the first magnet and besides the second magnet to shield a substrate within the plasma chamber from the second and fourth magnetic fields.

25. The plasma chamber of claim 19, wherein the center column includes a plasma electrode assembly and a plasma producing gas inlet.

26. The plasma chamber of claim 19, wherein the bottom plate is a part of the bottom wall of the plasma chamber, wherein each of the plurality of openings in the bottom plate interfaces with a corresponding one of the plurality of vacuum pumps.

27. A plasma processing chamber, comprising:
a bottom wall having a bottom plate;
a center column;
a wafer stage; and
a multi-valve port assembly including:
a plurality of actuator components coupled to a plurality of flow rate sensors to operate based on a plurality of flow rates measured by the plurality of flow rate sensors, wherein the plurality of actuator components include a first coil, wherein the bottom plate has the first coil, wherein the first coil transfers a first current to create a first magnetic field;
the bottom plate having a plurality of openings, wherein each of the plurality of openings in the bottom plate is configured to be in contact with a corresponding one of a plurality of vacuum pumps located outside the plasma processing chamber; and
a top plate surrounding a feed through port formed within the bottom wall of the plasma processing chamber, wherein the top plate has a first magnet that creates a second magnetic field that interferes with the first magnetic field to move the top plate with respect to the bottom plate in a vertical direction, wherein the plurality of openings in the bottom plate lie adjacent to and above the plurality of vacuum pumps, wherein the top plate has a plurality of plate portions and a plurality of openings, wherein the feed through port allows passage of the center column that supports the wafer stage, wherein the center column is narrower than the wafer stage, wherein the top plate rotates with respect to the plurality of openings in the bottom plate and achieves the movement in the vertical direction with respect to the bottom plate based on the plurality of flow rates measured by the plurality of flow rate sensors, wherein each of the plurality of openings in the bottom plate and the plurality of openings in the top plate and the plurality of plate portions of the top plate is equal in number to the plurality of flow rate sensors, wherein the plurality of flow rates are of materials flowing from the plasma processing chamber via the plurality of openings in the top plate and the plurality of the openings in the bottom plate to the plurality of vacuum pumps outside the plasma processing chamber, wherein the plurality of plate portions are controlled to rotatably move to be placed in one of an overlapping state, a plurality of degrees of partially overlapping states, and a non-overlapping state with respect to the plurality of openings in the bottom plate to change an amount of conductance of materials from within the plasma processing chamber to outside the plasma processing chamber, wherein the top plate is configured to vertically move with respect to the bottom plate to define one of a sealed state and an unsealed state with respect to the plurality of openings in the bottom plate to change the amount of the conductance of materials from within the plasma processing chamber to the plurality of vacuum pumps outside the plasma processing chamber.

28. The plasma processing chamber of claim 27, wherein a first one of the plurality of openings in the top plate is located next to a first one of the plurality of plate portions, a second one of the plurality of plate portions is located next to the first one of the plurality of openings, and a second one of the plurality of openings in the top plate is located next to the second one of the plurality of plate portions.

29. The plasma processing chamber of claim 28, wherein a shape of each of the plurality of openings in the top plate is the same as a shape of each of the plurality of openings in the bottom plate.

30. The plasma processing chamber of claim 27, wherein the top plate is configured to vertically move with respect to the bottom plate in a step-wise fashion so that the top plate defines a plurality of degrees of the unsealed state with respect to the bottom plate to change the amount of conductance of materials from within the plasma processing chamber to outside the plasma processing chamber.

* * * * *